United States Patent
Harris et al.

(10) Patent No.: US 11,804,250 B2
(45) Date of Patent: *Oct. 31, 2023

(54) MEMORY WITH DEFERRED FRACTIONAL ROW ACTIVATION

(71) Applicant: Rambus Inc., San Jose, CA (US)

(72) Inventors: James E. Harris, Tyler, TX (US); Thomas Vogelsang, Mountain View, CA (US); Frederick A. Ware, Los Altos Hills, CA (US); Ian P. Shaeffer, Los Gatos, CA (US)

(73) Assignee: Rambus Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/665,760

(22) Filed: Feb. 7, 2022

(65) Prior Publication Data

US 2022/0262412 A1 Aug. 18, 2022

Related U.S. Application Data

(63) Continuation of application No. 17/065,278, filed on Oct. 7, 2020, now Pat. No. 11,270,741, which is a
(Continued)

(51) Int. Cl.
| | | |
|---|---|---|
| *G11C 7/00* | (2006.01) | |
| *G11C 7/10* | (2006.01) | |
| *G11C 7/08* | (2006.01) | |
| *G11C 5/02* | (2006.01) | |
| *G11C 11/4076* | (2006.01) | |
| *G11C 11/408* | (2006.01) | |
| *G11C 11/4091* | (2006.01) | |
| *G11C 7/06* | (2006.01) | |
| *G11C 7/12* | (2006.01) | |
| *G11C 7/22* | (2006.01) | |

(Continued)

(52) U.S. Cl.
CPC ............ *G11C 7/1039* (2013.01); *G11C 5/025* (2013.01); *G11C 7/06* (2013.01); *G11C 7/065* (2013.01); *G11C 7/08* (2013.01); *G11C 7/12* (2013.01); *G11C 7/222* (2013.01); *G11C 8/08* (2013.01); *G11C 8/10* (2013.01); *G11C 11/4076* (2013.01); *G11C 11/4087* (2013.01); *G11C 11/4091* (2013.01)

(58) Field of Classification Search
CPC ........................................................ G11C 7/06
USPC ........................................................ 365/205
See application file for complete search history.

(56) References Cited

U.S. PATENT DOCUMENTS

| | | |
|---|---|---|
| 5,426,606 A | 6/1995 | Takai |
| 5,539,430 A | 7/1996 | Priem et al. |

(Continued)

OTHER PUBLICATIONS

International Search Report and Written Opinion dated Dec. 26, 2012 in International Application No. PCT/US212/041758. 10 pages.

(Continued)

*Primary Examiner* — Hoai V Ho
(74) *Attorney, Agent, or Firm* — Charles Shemwell

(57) ABSTRACT

Row activation operations within a memory component are carried out with respect to subrows instead of complete storage rows to reduce power consumption. Further, instead of activating subrows in response to row commands, subrow activation operations are deferred until receipt of column commands that specify the column operation to be performed and the subrow to be activated.

20 Claims, 23 Drawing Sheets

Related U.S. Application Data continuation of application No. 16/528,523, filed on Jul. 31, 2019, now Pat. No. 10,811,062, which is a continuation of application No. 15/889,191, filed on Feb. 5, 2018, now Pat. No. 10,388,337, which is a continuation of application No. 15/390,674, filed on Dec. 26, 2016, now Pat. No. 9,911,468, which is a continuation of application No. 15/138,424, filed on Apr. 26, 2016, now Pat. No. 9,570,126, which is a continuation of application No. 13/640,084, filed as application No. PCT/US2012/041758 on Jun. 8, 2012, now Pat. No. 9,330,735.

(60) Provisional application No. 61/512,133, filed on Jul. 27, 2011.

(51) Int. Cl.
  *G11C 8/08* (2006.01)
  *G11C 8/10* (2006.01)

(56) References Cited

U.S. PATENT DOCUMENTS

| | | |
|---|---|---|
| 6,240,039 B1 | 5/2001 | Lee et al. |
| RE37,409 E | 10/2001 | Richardson et al. |
| 7,362,641 B2 | 4/2008 | Morgan et al. |
| 7,660,183 B2 | 2/2010 | Ware et al. |
| 8,873,329 B1 | 10/2014 | Zheng et al. |
| 9,330,735 B2 | 5/2016 | Harris et al. |
| 9,570,126 B2 | 2/2017 | Harris et al. |
| 9,911,468 B2 | 3/2018 | Harris et al. |
| 10,388,337 B2 | 8/2019 | Harris et al. |
| 10,811,062 B2 | 10/2020 | Harris et al. |
| 11,270,741 B2 * | 3/2022 | Harris .................. G11C 8/08 |
| 2004/0196699 A1 | 10/2004 | Vogelsang |
| 2005/0154853 A1 | 7/2005 | Barth et al. |
| 2006/0158950 A1 | 7/2006 | Klein |
| 2007/0250677 A1 | 10/2007 | Ware et al. |
| 2008/0094933 A1 | 4/2008 | Kim |
| 2009/0116309 A1 | 5/2009 | Hanzawa et al. |
| 2010/0262790 A1 | 10/2010 | Perego et al. |
| 2011/0305098 A1 | 12/2011 | Choi |
| 2014/0208156 A1 | 7/2014 | Muralimanohar et al. |

OTHER PUBLICATIONS

Udipi, Aniruddha et al., "Rethinking DRAM Design and Organization for Energy-Constrained Multi-Cores", ISCA 10, Jun. 19-23, 2010 Saint-Malo, France. 12 Pages.

* cited by examiner

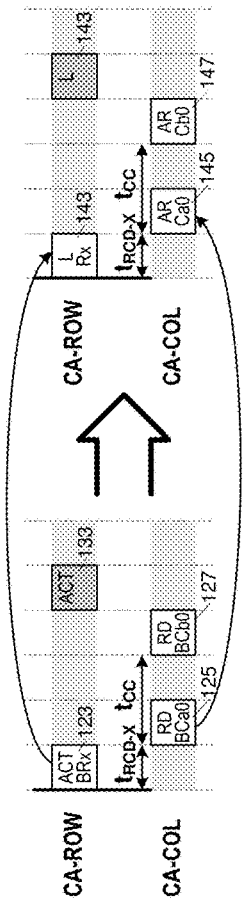

FIG. 2A

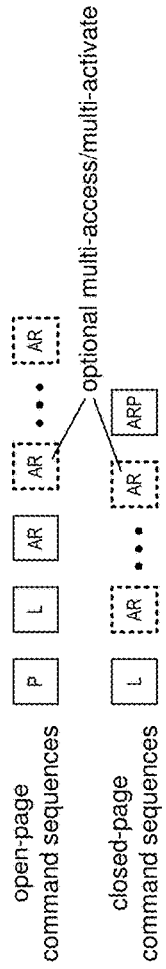

| Row Command | OP | Device | Bank | Row |
|---|---|---|---|---|

| Command | | Address Fields | Event(s) Triggered | Delay Imposed |
|---|---|---|---|---|
| Load | L | Device, Bank, Row | Load row address into row address register, decoding to pre-select global word line | none |
| Precharge | P | Device, Bank | Pre-charge bank | $t_{RP}$ prior to sub-row activation |
| Activate-Read (or Write) | AR | Device, Bank, Column | Activate sub-row indicated by MSBs of column address, then read (or write) column of data indicated by column address | $t_{RCD-Y}$ prior to column read or write, then $t_{CAC}$ prior to read data output or $t_{CWD}$ prior to write data storage |
| Activate-Read-Precharge | ARP | Device, Bank, Column | Activate sub-row, then read (or write) column of data, then precharge bank | $t_{RCD-Y}$ prior to read/write, then (i) $t_{CAC}/t_{CWD}$ prior to data output/storage and (ii) $t_{RDP}/t_{WRP}$ prior to bank precharge |

| Column Command | OP | Device | Bank | Column |
|---|---|---|---|---|

MSBs → | Subpage (SP) | Offset (O) |

| Event | R/W | BL |

FIG. 2B

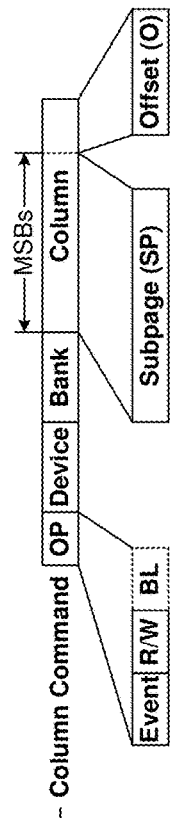

FIG. 3

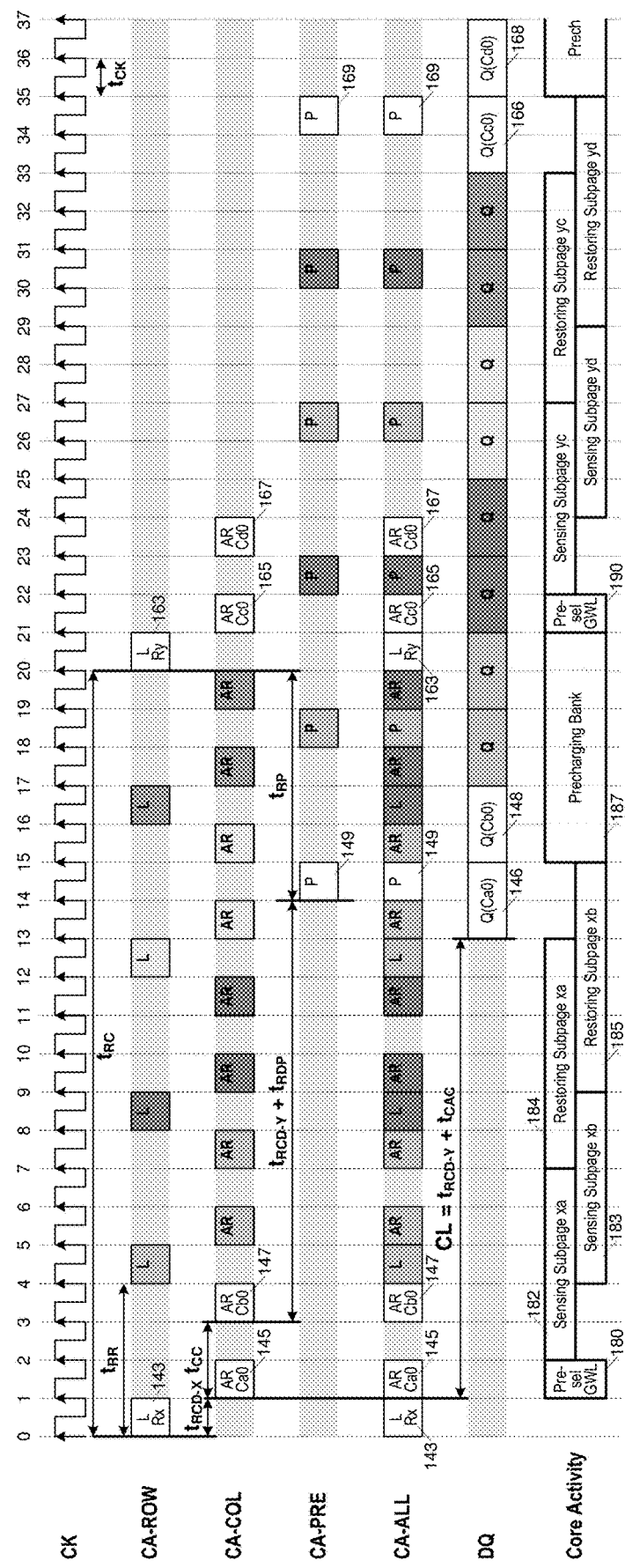
FIG. 4A    Memory protocol w/ deferred activate, explicit precharge

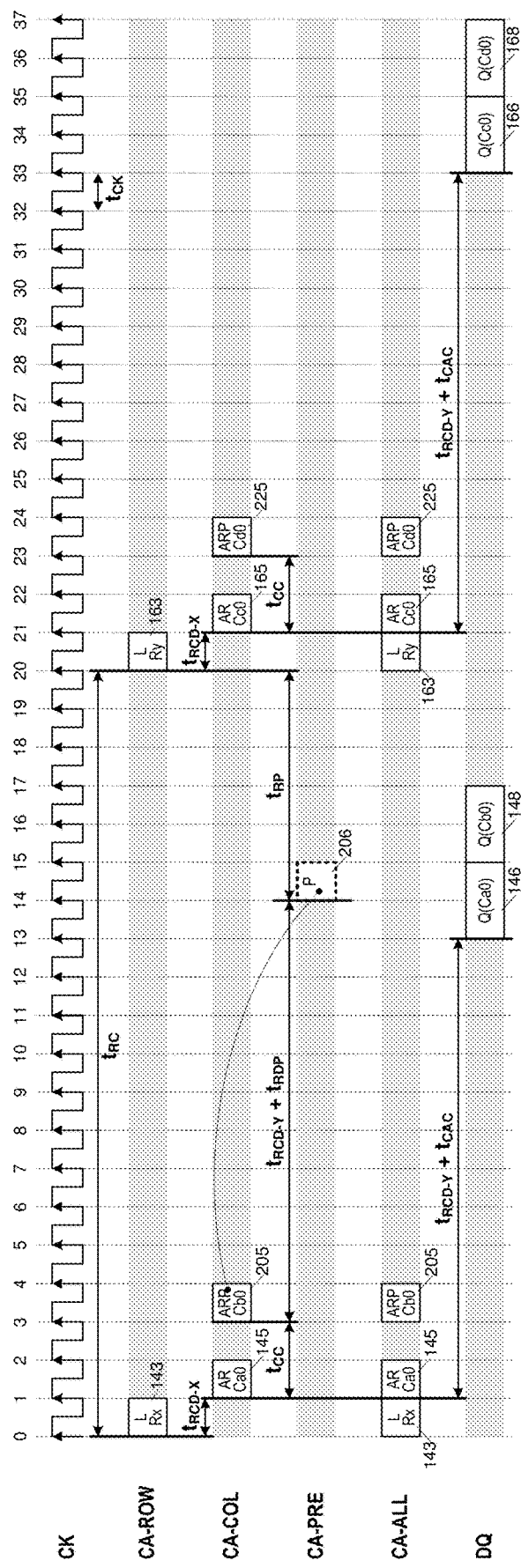
FIG. 4B *Memory protocol w/ deferred activate, deferred auto-precharge*

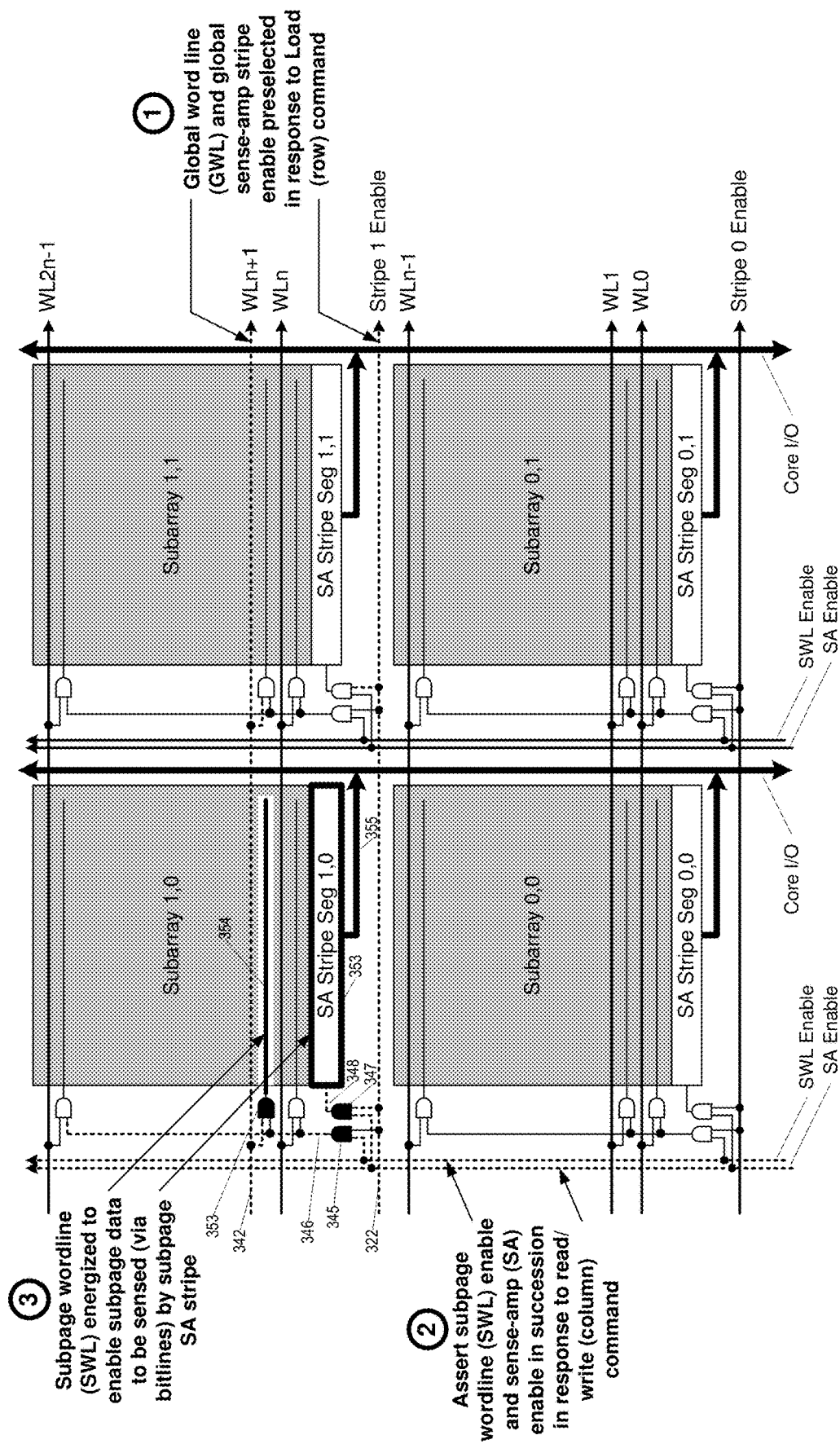

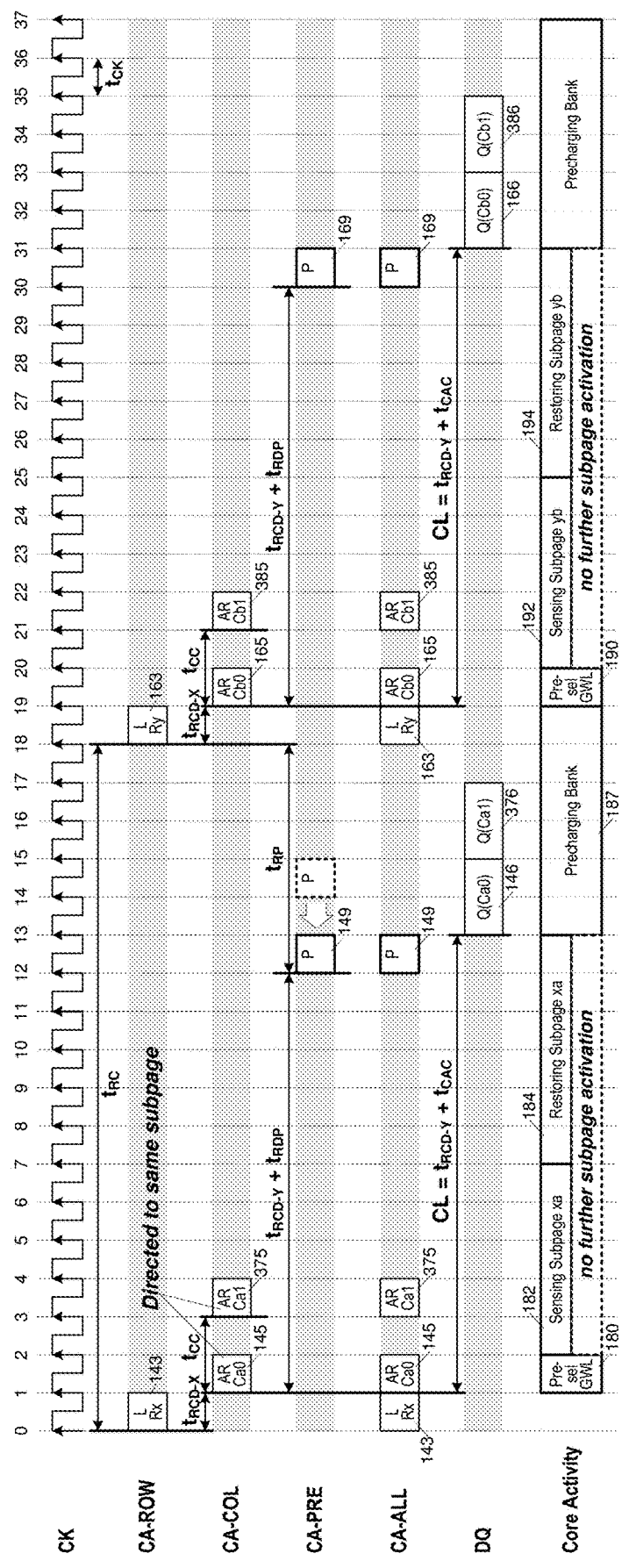
FIG. 7A  Subpage-Aware transaction protocol: multiple subpage accesses per subpage activation

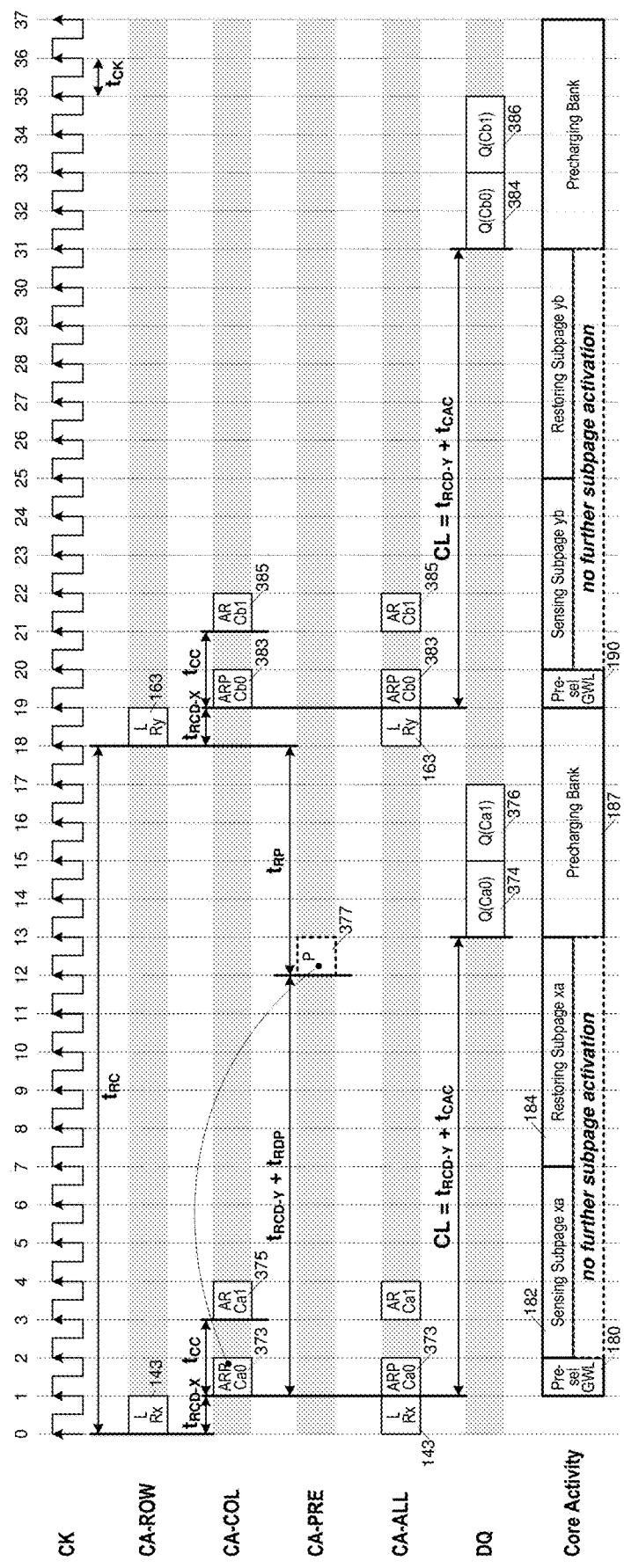
FIG. 7B  Subpage-Aware transaction protocol: multiple subpage accesses per subpage activation; Auto-precharge

FIG. 8

| Row Command | OP | Device | Bank | Row |

| Command | Address Fields | Event(s) Triggered | Delay Imposed |
|---|---|---|---|
| L Load | Device, Bank, Row | Load row address into row address register, decoding to pre-select global word line | none |
| P Precharge | Device, Bank | Pre-charge bank | $t_{RP}$ prior to sub-row activation |
| AR Activate-Read (or Write) | Device, Bank, Column | Activate sub-row indicated by MSBs of column address, then read (or write) column of data indicated by column address | $t_{RCD\text{-}Y}$ prior to column read or write, then $t_{CAC}$ prior to read data output or $t_{CWD}$ prior to write data storage |
| R Read (or Write) | Device, Bank, Column | Read (or Write) column of data | $t_{CAC}$ prior to read data output or $t_{CWD}$ prior to write data storage |
| ARP Activate-Read-Precharge | Device, Bank, Column | Activate sub-row, then read (or write) column of data, then precharge bank | $t_{RCD\text{-}Y}$ prior to read/write, then (i) $t_{CAC}$/$t_{CWD}$ prior to data output/storage and (ii) $t_{RDP}$/$t_{WRP}$ prior to bank precharge |
| RP Read-Precharge | Device, Bank, Column | Read (or Write) column of data, then pre-charge bank | $t_{RDP}$ or $t_{WRP}$ prior to bank precharge |

| Column Command | OP | Device | Bank | Column |

| Event | R/W | BL | | Subpage (SP) | | Offset (O) |

MSBs ← Column

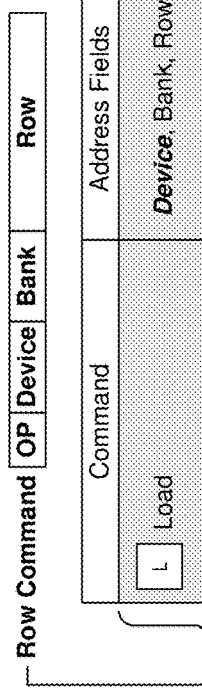

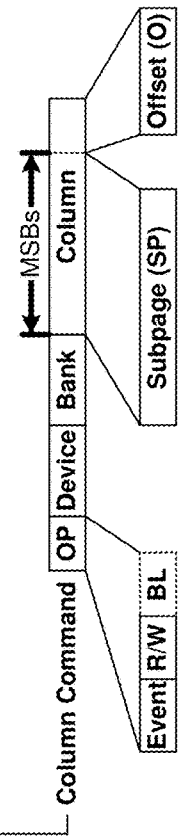

FIG. 9 open-page command sequences ← 391 closed-page command sequences ← 392

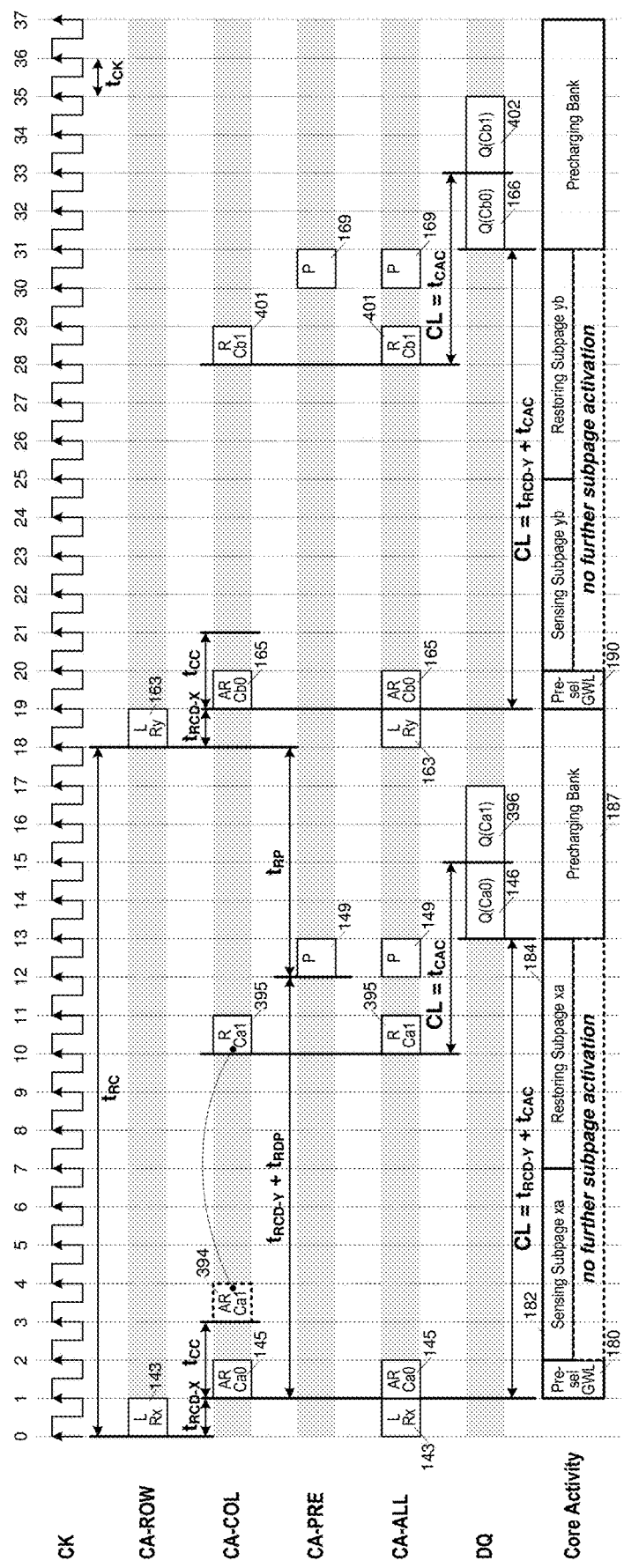
FIG. 10A  Subpage-Aware Transaction Protocol: differentiated column commands to enable access-specfic CL; explicit precharge

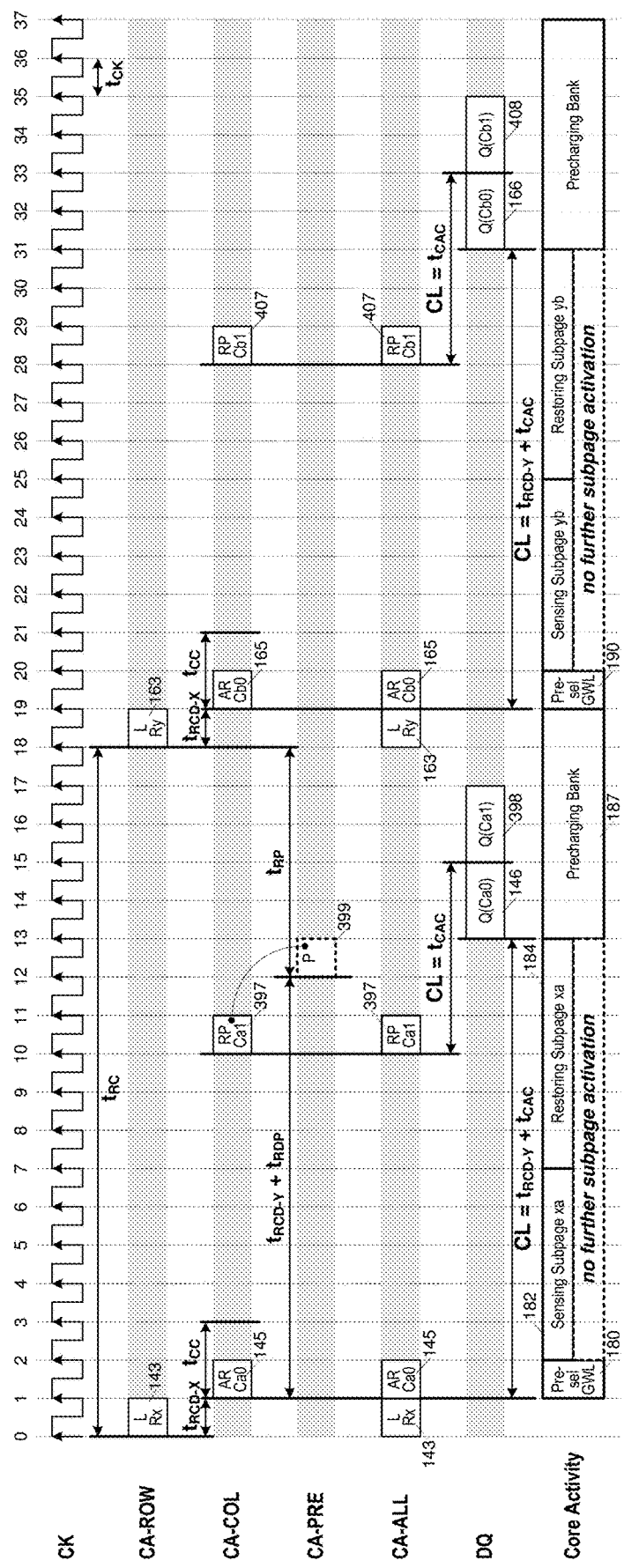
FIG. 10B   Subpage-Aware Transaction Protocol: differentiated column commands to enable access-specfic CL; auto-precharge

FIG. 11

Row Command: | OP | Device | Bank | Row |

| Command | | Address Fields | Event(s) Triggered | Delay Imposed |
|---|---|---|---|---|
| L | Load | Device, Bank, Row | Load row address into row address register, pre-decoding to select global word line | none |
| LP | Load-Precharge | Device, Bank, Row | Load row address into row address register and concurrently pre-charge bank | $t_{RP}$ prior to sub-row activation |
| P | Precharge | Device, Bank | Pre-charge bank | $t_{RP}$ prior to sub-row activation |
| R | Read (or Write) | Device, Bank, Column | Read (or Write) column of data | $t_{CAC}$ prior to read data output or $t_{CWD}$ prior to write data srotage |
| AR | Activate-Read | Device, Bank, Column | Activate sub-row indicated by MSBs of column address, then read (or write) column of data indicated by column address | $t_{RCD-Y}$ prior to column read or write, then $t_{CAC}$ prior to read data output or $t_{CWD}$ prior to write data storage |
| PAR | PrechargeDelay-Activate-Read | Device, Bank, Column | Delay to allow previously-commanded precharge to complete, then execute Activate/Read | $t_{RP}$-$t_{RCD-X}$ prior to sub-row activation, then $t_{RCD-Y}$, then $t_{CAC}$ or $t_{CWD}$ |
| RP | Read-Precharge | Device, Bank, Column | Read (or Write) column of data, then pre-charge bank | $t_{RDP}$ or $t_{WRP}$ prior to bank precharge |
| ARP | Activate-Read-Precharge | Device, Bank, Column | Activate sub-row, then read (or write) column of data, then precharge bank | $t_{RCD-Y}$ prior to read/write, then (i) $t_{CAC}$/$t_{CWD}$ prior to data output/storage and (ii) $t_{RDP}$/$t_{WRP}$ prior to bank precharge |
| PARP | PrechargeDelay-Activate-Read-Precharge | Device, Bank, Column | Delay to allow previously-commanded precharge to complete, then execute Activate/Read/Precharge | $t_{RP}$-$t_{RCD-X}$ prior to SR activation, then $t_{RCD-Y}$, then (i) $t_{CAC}$/$t_{CWD}$ prior to data output/ storage & (ii) $t_{RDP}$/$t_{WRP}$ prior to precharge |

Column Command: | OP | Device | Bank | Column |

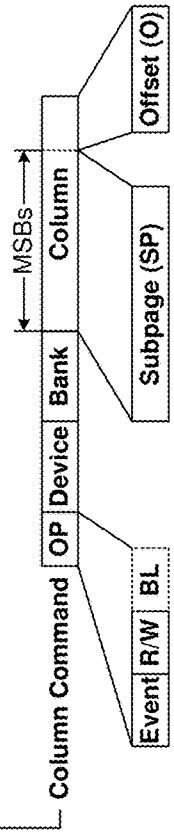

Event | R/W | BL

Column: MSBs — Subpage (SP) | Offset (O)

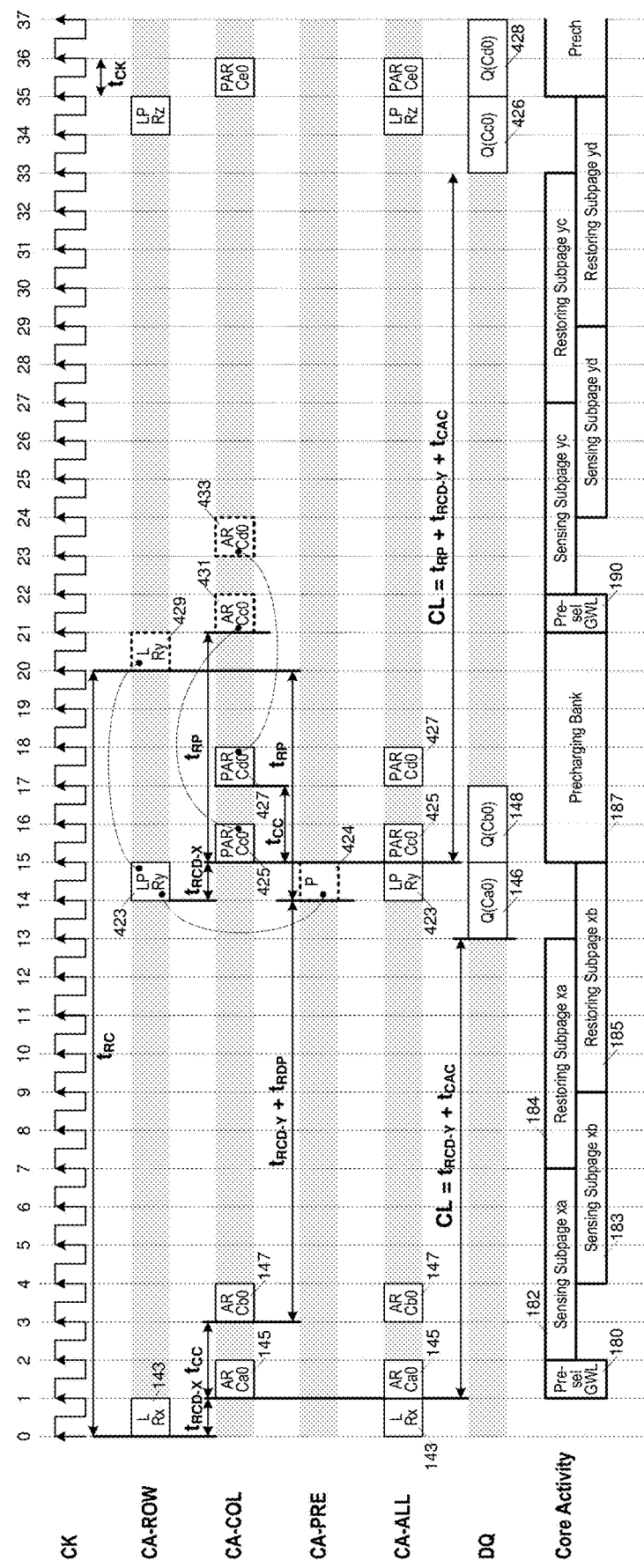
FIG. 13A    Memory protocol w/ twice-deferred activate

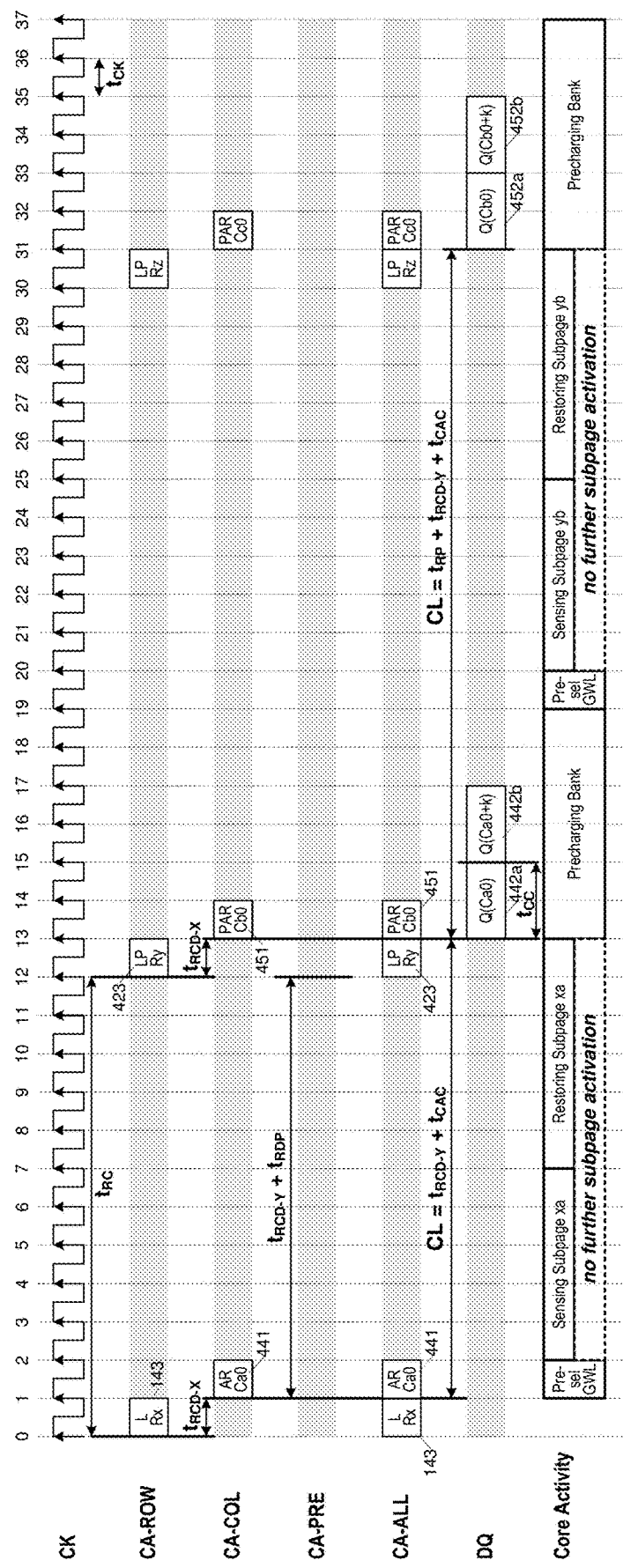
FIG. 13B  *Memory protocol w/ twice-deferred activate, double-burst*

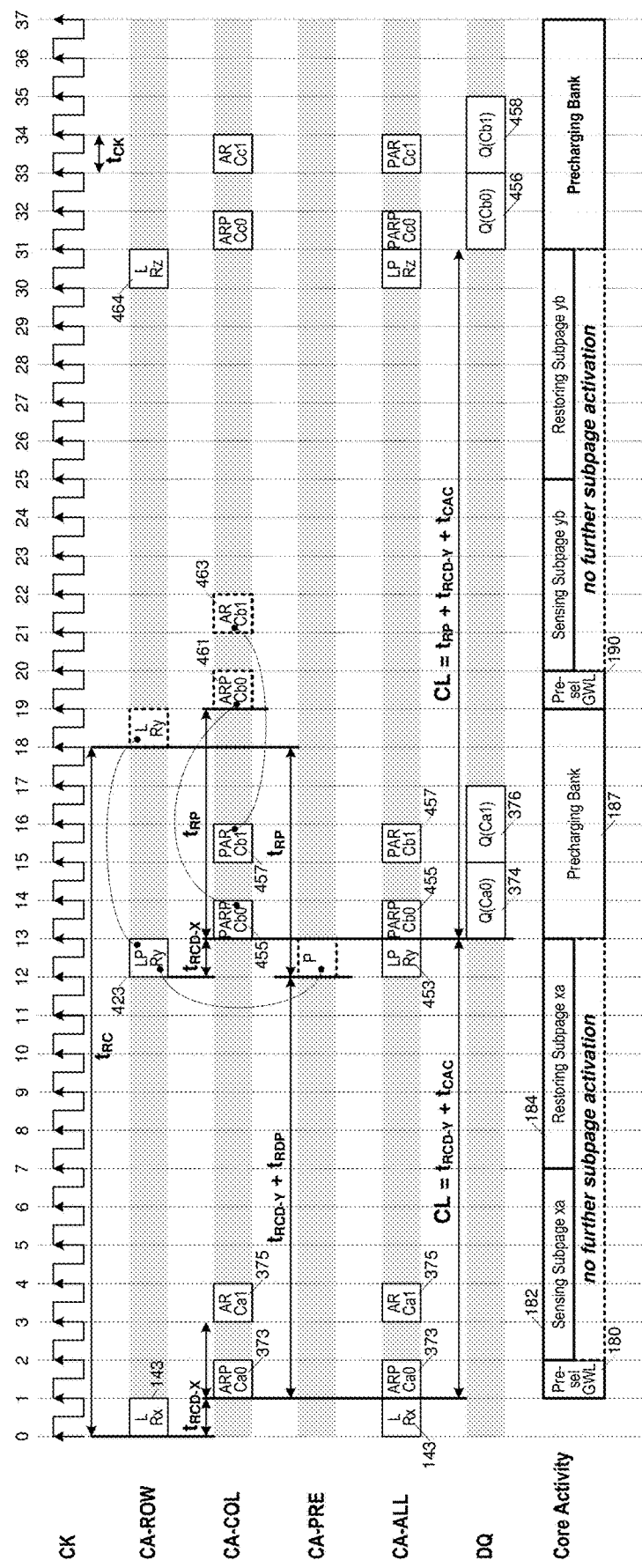
FIG. 13C  Subpage-aware memory protocol w/ twice-deferred activate

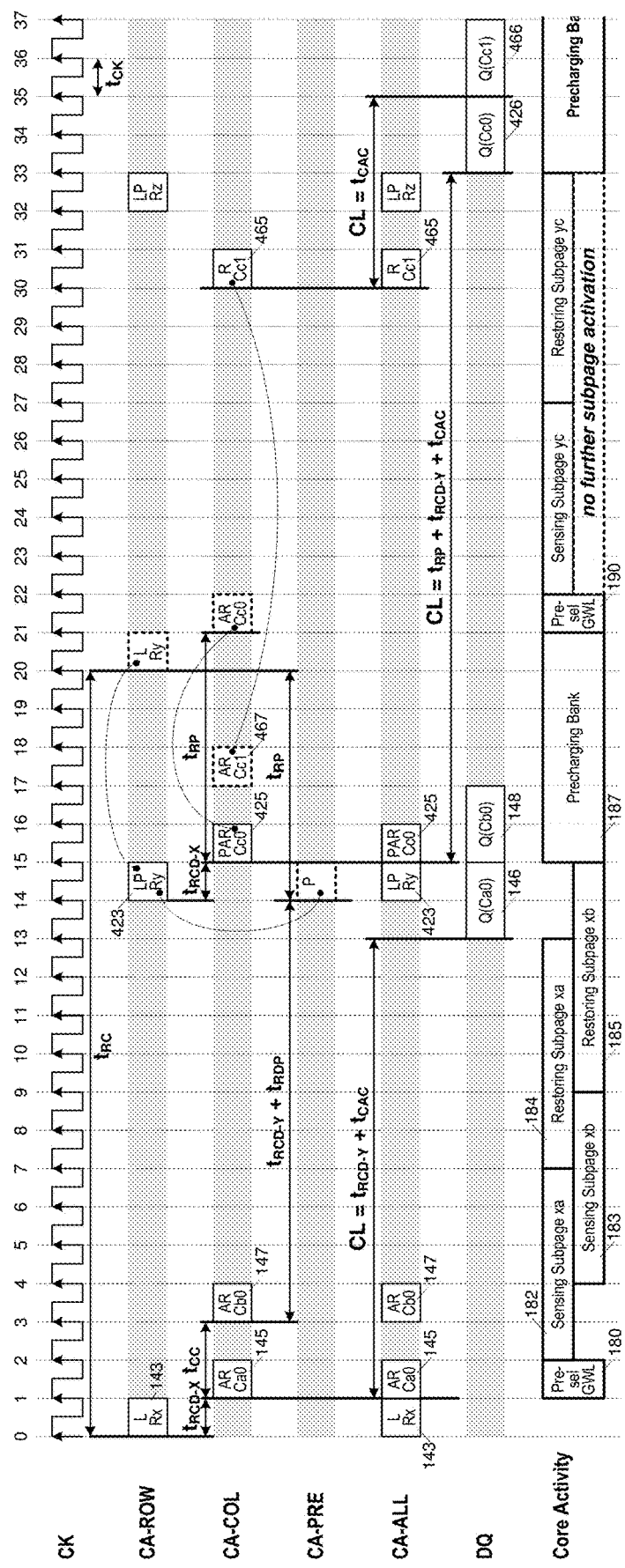
FIG. 13D  Subpage-Aware Transaction Protocol: twice-deferred activate, differentiated column commands to enable access-specfic CL

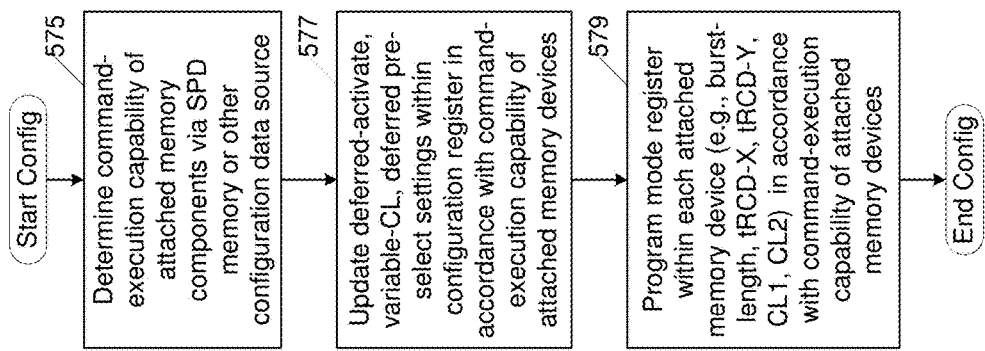
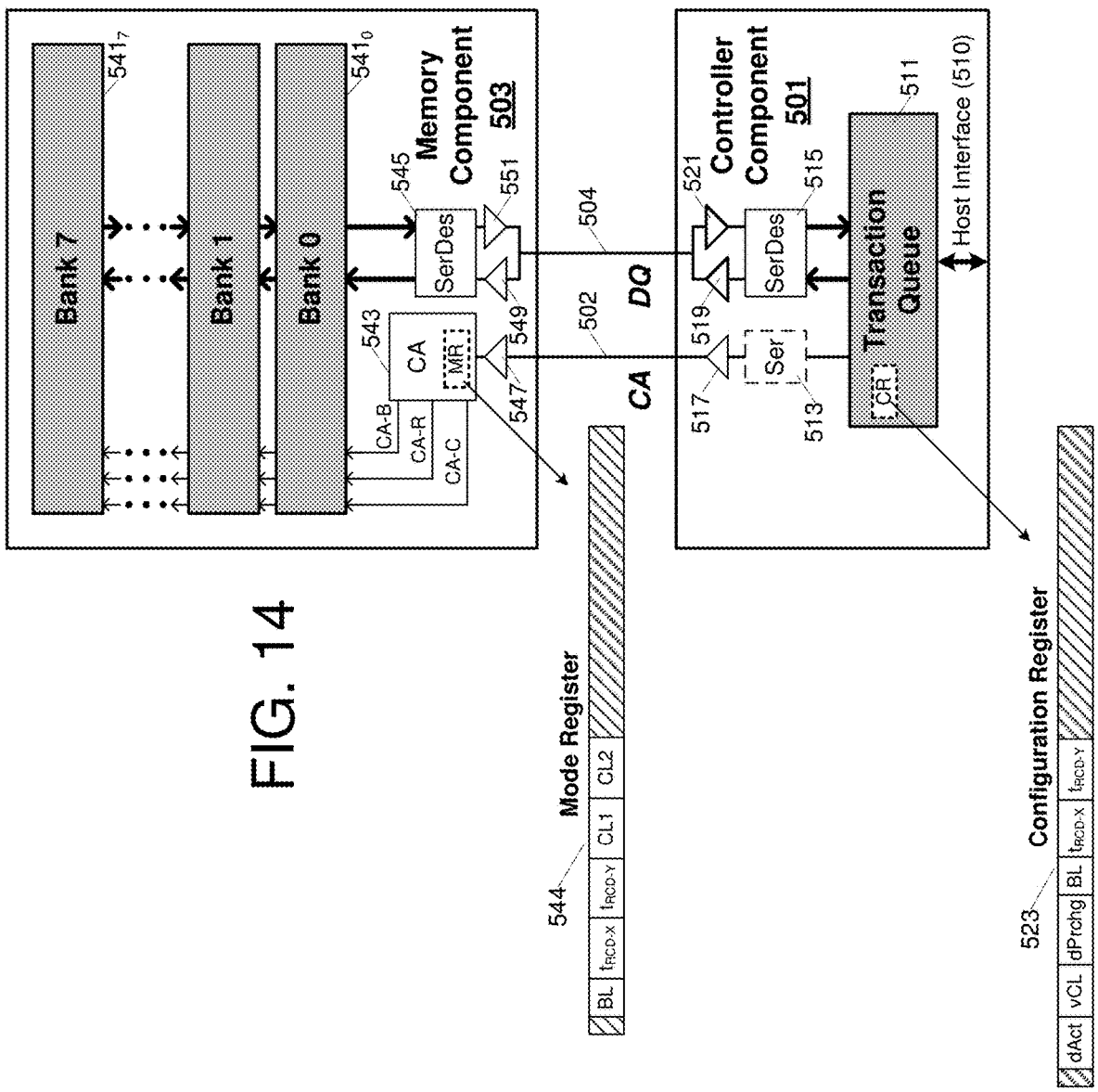

__US 11,804,250 B2__

MEMORY WITH DEFERRED FRACTIONAL ROW ACTIVATION

CROSS REFERENCE TO RELATED APPLICATIONS

This application is a continuation of U.S. application Ser. No. 17/065,278 filed Oct. 7, 2020 (now U.S. Pat. No. 11,270,741), which is a continuation of U.S. application Ser. No. 16/528,523 filed Jul. 31, 2019 (now U.S. Pat. No. 10,528,523), which is a continuation of U.S. application Ser. No. 15/889,191 filed Feb. 5, 2018 (now U.S. Pat. No. 10,388,337), which is a continuation of U.S. application Ser. No. 15/390,674 filed Dec. 26, 2016 (now U.S. Pat. No. 9,911,468), which is a continuation of U.S. application Ser. No. 15/138,424 filed Apr. 26, 2016 (now U.S. Pat. No. 9,570,126), which is a continuation of U.S. application Ser. No. 13/640,084 filed Oct. 9, 2012 (now U.S. Pat. No. 9,330,735), which is a U.S. National Stage of International Application No. PCT/US2012/041758 filed Jun. 8, 2012, which claims priority to U.S. Provisional Patent Application No. 61/512,133 filed Jul. 27, 2011. Each of the above-identified patent applications is hereby incorporated by reference in its entirety.

TECHNICAL FIELD

The present disclosure relates generally to the field of integrated circuits, and more particularly to memory access operations within integrated-circuit memory devices.

BACKGROUND

Dynamic random access memories (DRAMs) are typically accessed in two phases. First, an address-specified page of data is transferred from a row of DRAM storage cells to a bank of sense amplifiers in a row activation operation. Thereafter, one or more column read or write operations are executed to retrieve or overwrite address-specified fractions (columns) of the page of data within the sense amplifier bank, thus reading or writing column data within the open page.

Row activation tends to be particularly time consuming, as low-amplitude signals stored within individual storage cells are sensed via long, high-capacitance bit lines. To mitigate this timing bottleneck, DRAMs have traditionally been architected with relatively high row to column ratios (e.g., 64:1 or 128:1) to increase the likelihood that back-to-back memory accesses will "hit" the same open page (i.e., exploiting spatial/temporal locality), and thus enable multiple relatively low-latency column operations per row activation. Unfortunately, the power expended to activate a given storage row is largely wasted as the vast majority of the data transferred to the sense amplifiers during row activation is untouched in ensuing column operations.

BRIEF DESCRIPTION OF THE DRAWINGS

The various embodiments disclosed herein are illustrated by way of example, and not by way of limitation, in the figures of the accompanying drawings and in which like reference numerals refer to similar elements and in which:

FIG. 2A illustrates an exemplary transition from the deferred-activation command nomenclature of FIG. 1 to a row-load (L) and activate-read/write (AR) command nomenclature shown in later figures;

FIG. 2B presents a table of exemplary deferred-activation commands;

FIG. 3 illustrates the general format of exemplary open-page and closed-page command sequences employing the deferred-activation commands shown in FIG. 2B;

FIG. 4A illustrates an exemplary open-page, deferred-activation memory protocol within a synchronous memory system;

FIG. 4B illustrates an exemplary closed-page deferred-activation protocol in which a command sequence directed to a given row and bank is concluded by an activate-read-precharge command;

FIG. 6C illustrates the state of memory bank architecture of FIG. 6B following receipt of a column command;

FIG. 7A illustrates a reduced-latency transaction protocol that may be implemented by a controller component that is aware of (i.e., designed to assume or detect the presence of) the deferred activation, subpage-access memory component architecture described in reference to FIGS. 5A-5D and 6A-6C;

FIG. 7B illustrates another exemplary subpage-aware transaction protocol that employs an auto-precharging activate-read command out of order with respect to a non-precharging activate-read command;

FIG. 8 illustrates an alternative set of exemplary deferred-activation commands that includes a pair of non-activating column commands, "Read" and "Read-Precharge."

FIG. 9 illustrates closed-page and open-page access sequences supported by a memory system that explicitly differentiates between activating and non-activating column commands;

FIGS. 10A and 10B illustrate examples of open-page and closed-page memory protocols, respectively, corresponding to the activation-differentiated column command sequences shown in FIG. 9;

FIG. 11 illustrates three additional command types that may be supported within a deferred-activation memory system, including an additional row command and two additional activation-triggering column commands;

FIG. 13A illustrates an exemplary open-page memory protocol employing a load-precharge command;

FIG. 13B illustrates an alternative command sequence that employs a load-precharge command to reduce CA bandwidth consumption, and in which each subpage-activating column command triggers output of two bursts of data from respective address ranges;

FIG. 13C illustrates another exemplary open-page memory protocol employing a load-precharge command followed by an auto-precharging column command and then a non-activating column command;

FIG. 13D illustrates another exemplary open-page memory protocol employing a load-precharge command followed by a non-auto-precharging precharge-delay column command and then by a low-latency, non-activating column command;

FIG. 14 illustrates embodiments of a controller component and memory component that may be used to implement the various deferred-activation command sequences and protocols described in reference to preceding figures; and FIG. 15 illustrates a sequence of configuration operations that may be executed by the controller component of FIG. 14 to enable deferred-activation operations.

DETAILED DESCRIPTION

In various embodiments disclosed herein, row activation operations within a memory component are carried out with respect to fractions of storage rows or "subrows" instead of complete storage rows, thereby substantially lowering activation power consumption. Further, instead of executing subrow activation operations in response to row commands (i.e., commands bearing row address values), subrow activation operations are deferred until receipt of column commands that specify the column operation to be performed (e.g., read or write) and the subrow to be activated. By this arrangement, sub-row address bits are delivered within column commands where they naturally form part or all of the column address instead of being redundantly transmitted in row commands. Moreover, by pipelining deferred subrow activation operations, peak memory bandwidth remains uncompromised, and by re-timing column command transmission to immediately follow row command transmission, no or negligible additional access latency is incurred. Accordingly, within various embodiments disclosed herein, deferred fractional row activation yields reduced power consumption without sacrificing command/address bandwidth or peak memory bandwidth and with no or negligible access latency increase.

Figure 1:
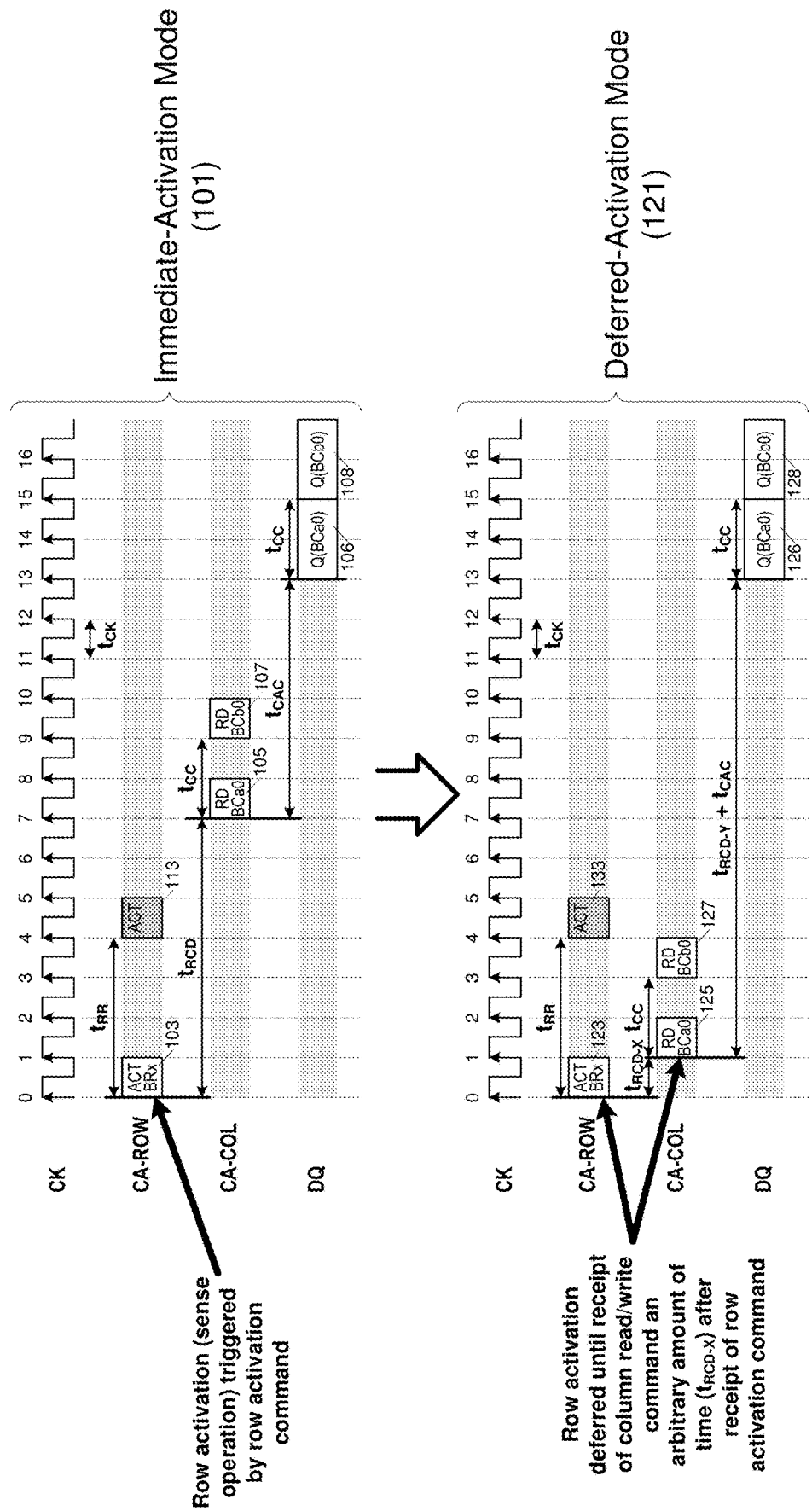
FIG. 1 contrasts exemplary immediate-activation and deferred-activation memory control modes.

FIG. 1 contrasts two exemplary memory control modes supported by a memory controller according to embodiments disclosed herein. In an immediate-activation mode shown at 101, a row activation command 103 (ACT BRx) directed to a given bank 'B' and storage row 'Ra' of a memory component is transmitted via a command/address (CA) signaling path. Row activation is triggered in response to the row activation command (hence the "immediate-activation" mode), with data from all storage cells associated with the specified row being transferred to a bank of sense amplifiers during row-activation interval $t_{RCD}$. After the row activation interval has elapsed, a column access command 105 (RD BCa0) directed to the row-activated bank 'B' and bearing column address 'Ca0' is transmitted via the CA signaling path (note that the row-activation and column read/write command sequences are shown in separate timing sequences, designated "CA-ROW" and "CA-COL" but may be nonetheless transmitted via a shared set of CA signaling links) to trigger a column access operation, in this case a column read operation (RD) in which the recipient memory device outputs a column of read data from the specified column 'Ca0' of the open page (i.e., the row data within the sense amplifier bank) of the specified bank. Accordingly, after a column access interval $t_{CAC}$, read data, Q(BCa0) 106, is output via a set of read/write data signaling links (DQ) over a $t_{CC}$ interval (i.e., minimum time between successive column operations within the memory component). As shown, a second column read command 107 directed to column 'Cb0' (i.e., bearing column address 'Cb0') is received a $t_{CC}$ interval after the initial column read command and thus yields read data output Q(BCb0) 108 a $t_{CAC}$ interval later. Similarly, a second row command 113 is received a $t_{RR}$ interval after row command 103 to begin row activation in another bank of the memory component and thus maintain peak data transfer bandwidth of the memory component.

In deferred-activation mode 121, a "nominal" activation command 123 directed to a given bank 'B' and storage row 'Ra' is received at t0 (i.e., clock cycle 0), but instead of responsively executing a row activation operation, row activation is deferred until receipt of a column read/write command an arbitrary amount of time ($t_{RCD-X}$) later. More specifically, in the example shown, a column read command is received one clock cycle after the nominal activation command (i.e., activation deferral interval or pre-activation delay, $t_{RCD-X}$ is a single clock cycle, $t_{CK}$, in the example shown), and column address bits therein are applied, in combination with the row address 'Ra' supplied in row command 123, to trigger activation of a fractional portion of the row of data specified by the row address. That is, the row address pre-selects the row (or page) to be fractionally activated, and the most significant bits of the later-arriving column address select the particular fraction of the row to be activated. Thus, the column command triggers activation of a subrow (also referred to herein as a "subpage") identified in part by the column address provided in the column command, and in part by the row address provided in a preceding row command.

Still referring to FIG. 1, the subpage identified by the column and row addresses is activated over a subpage activation interval $t_{RCD-Y}$, and a column read operation is executed with respect to all or a part of the activated subpage over a $t_{CAC}$ interval so that the total delay between receipt (or registration) of activation-triggering column command 125 and output of corresponding read data, Q(BCa0) 126, is shown as the combination of those two time intervals. Comparing the deferred-activation and immediate-activation modes, the net latency between initial row-command receipt and data output is the same despite the additional pre-activation delay ($t_{RCD-X}$) within the deferred-activation pipeline. While this need not be the case (i.e., the net transaction latency in deferred-activation mode may be longer or shorter than in immediate-activation mode), in one embodiment subpage activation takes slightly less time than activation of a complete row due in part to reduced power supply noise (i.e., less current is drawn in the fractional activation, thus reducing switching noise) and, as explained further below, due to pre-selection of a global word line prior to receipt of activation-triggering column command 125. In any case, as in immediate-activation mode, a second column read command (RD BCb0, 127), received a $t_{CC}$ interval after column read command 125, triggers output of a second column of read data, Q(BCb0) 128 back to back (i.e., without intervening time delay) with respect to the first column of read data. As discussed below, the second column command 127 may trigger another subpage activation, activating a second fraction of the row specified by row command 123, or may access a column of data within the subpage specified by initial column read command 125. Accordingly, within a deferred-activation memory system, column commands may be distinguished as "activating" or non-activating, depending upon whether their column addresses specify an unopened or open subpage, respectively. Further, as discussed below, differences in operational timing that apply between activating and non-activating column commands may be exploited by a controller component designed with awareness of the subpage architecture (e.g., subpage size) of the memory component. For example, such a "subpage-aware" controller component may command precharge operations at an earlier time following a non-activating column command than an activating column command on the understanding that no row restore operation is required by the non-activating column command. A subpage-aware controller may also explicitly differentiate non-activating and activating column commands in a given command sequence (e.g., sending one type of command code to indicate an activating column command, and another type of command code to indicate a non-activating column command) to exploit the reduced column latency possible in the non-activating scenario.

Reflecting on the deferred-activation mode command sequences and considering in particular that "row activation command" 123 does not in fact trigger an activation operation (i.e., data within core storage cells are not sensed in response to receipt of row command 123), it follows that an alternative command nomenclature that more clearly reflects the actions triggered by individual deferred-activation mode commands may avoid confusion. More specifically, because row command 123 in actuality serves to load (or register) a row address within the recipient memory component rather than trigger a row activation operation, such row-address bearing commands are referred to in embodiments that follow as "load" commands or "row-load" commands. Similarly, because column read and column write commands may trigger subpage (or subrow) activation operations, such column-address bearing commands are referred to herein as activate-read and activate-write commands. FIG. 2A illustrates an exemplary transition from the deferred-activation command nomenclature of FIG. 1 to the row-load (L) and activate-read/write (AR) command nomenclature. Note that the bank address 'B', while present in all commands directed to a given storage bank, is implicitly rather than explicitly indicated in the revised nomenclature, with commands directed to a given storage bank indicated by like-shading (or lack thereof). Thus, load command 143 (directed to row 'Rx') and activate-read commands 145 and 147 (directed to columns 'Ca0' and 'Cb0', respectively) are directed to the same storage bank, while load command 143 (row address not specifically shown and corresponding to command 133 in FIG. 1) is directed to a different storage bank. Also, in FIG. 2A and various command listings and transaction diagrams that follow, column read commands (e.g., activate-read "AR") are depicted instead of column write commands. Any such commands may alternatively be column write commands (e.g., activate-write commands) with column-access timing intervals ($t_{CAC}$) being replaced by column-write delay intervals ($t_{CWD}$).

FIG. 2B presents a table of exemplary deferred-activation commands, including row commands, "load" and "precharge," and column commands "activate-read" and "activate-read-precharge." As shown, each of the row commands includes operation code (OP), device-address (Device), bank address (Bank) and row address (Row) fields that identify, respectively, the operation to be performed (e.g., load or precharge in the listing shown), the memory component to which the command is directed, one of multiple storage banks within the memory component and, at least in the case of a load command, the row of storage cells of interest. The device-address field may convey an encoded device ID value (e.g., to be compared with a preloaded or otherwise predetermined memory component ID and thus enable selection of one of multiple memory components to which the row command is transmitted) or a fully-decoded set of chip-select signals transmitted via chip-select lines to respective memory components. In the latter arrangement a memory controller component may raise one of the chip-select lines (i.e., one-hot configuration of chip-select signals) to select, as the target device, one of multiple memory components coupled to the command/address path by which the row command is transmitted.

As shown, the row address may be omitted from the precharge command (and the command thus viewed as a "bank" command instead of a row command) as that command triggers a bank precharge operation (decoupling a previously activated set of storage cells from bit lines of the memory component and arming the corresponding sense amplifiers for a subsequent activation operation) that may be performed without identifying the row corresponding to the previously activated storage cells. By contrast, a row address is supplied with (i.e., as part of or in association with) each load command and loaded into a row address storage element (e.g., register or latch) in response to command receipt. A row-address decode operation may also be executed in response to the load command to select and assert a "global" word line that extends across multiple subpages of the address-specified bank. As explained in further detail below, asserting the global word line (i.e., asserting a control signal on the global word line) does not itself trigger an activation operation, and instead serves to "preselect" the row of storage cells in which sub-page activation will eventually occur. Accordingly, the row-address load and decode operation is also referred to herein as a "preselect operation," as the global word line and thus the corresponding row of storage cells within the address-specified storage bank are preselected in preparation for eventual subpage activation. In each of the embodiments disclosed herein, the row address decode operation indicated by a load command may be commenced prior to receipt of corresponding column commands, thereby hiding the row-address decode time under the delay between row and column command receipt.

Still referring to the command listing shown in FIG. 2B, each of the column commands includes an operation code (OP), device address (Device), bank address (Bank) and column address (Column). In one embodiment, the operation code includes an event field (also referred to herein as an event specifier) that indicates the actions to be carried out in response to the command (e.g., activate, read/write, precharge, etc.), a read/write bit (R/W) that indicates whether the column operation is a read or write operation, and an optional burst-length field (BL) that indicates the length of the outgoing read data sequence or the incoming write data sequence and thus the quantum of read data to be output or write data to be stored in response to the column command.

Still referring to FIG. 2B, when an activate-read command is received following a load command, a subpage indicated by the column address is activated over subpage-activation interval $t_{RCD\text{-}Y}$ (i.e., as shown in the deferred-activation transaction of FIG. 1), an operation in which constituent data bits of the specified subpage are transferred via bit lines to respective sense amplifiers and latched therein, thereby rendering the subpage "open" and available for column access. Following subpage activation, a column of read data specified by the column address is transferred from the open subpage (i.e., within the sense amplifier set) to a data input/output (I/O) interface over column-read access interval, $t_{CAC}$, and then output from the memory component over column-to-column interval, $t_{CC}$. After read data output, the activate-read operation is deemed complete, though the subpage remains open within the sense amplifiers. A similar sequence of actions is carried out in response to an activate-write command, except that write data is received within the memory component over a $t_{CC}$ interval and, when subpage activation is complete, transferred to an address-specified column of sense amplifiers (within the activated subpage) over a column-write access interval, $t_{CWD}$.

An activate-read-precharge command triggers the same actions as an activate-read command and additionally triggers an automatic precharge operation ("auto-precharge") a predetermined time, $t_{RDP}$, after completing subpage activation, with the tRDP interval spanning the time required to complete read access to the sense amplifiers containing the open subpage so that the open subpage may be closed and the sense amplifiers re-armed for a subsequent activation operation. Similarly, an activate-write-precharge command triggers the same actions as an activate-write command and additionally triggers an auto-precharge operation a predetermined time, $t_{WRP}$, after completing subpage activation, with the $t_{WRP}$ interval spanning the time required to complete write access to the sense amplifiers containing the open subpage. In general, the auto-precharge operation triggered by an activate-read-precharge or activate-write-precharge command is functionally equivalent to an auto-precharge operation in the immediate-activation mode shown in FIG. 1, but with different internal timing to account for the subpage activation delay.

In a number of embodiments described herein, the column of data accessed in response to an activate-read or activate-write command is smaller than the activated subpage. In the embodiment corresponding to the command table of FIG. 2B, for example, the most significant bits of the column address are applied as a subpage address (SP) to select the subpage (i.e., one of multiple subpages spanned by the row indicated by a preceding row-load command) to be activated, while the complete (and more resolute) column address is supplied to column decoder circuitry to select one of multiple columns of data encompassed by the activated subpage. By this arrangement, one or more additional column operations (read or write) may be issued following a subpage-activating column command to effect low-latency read/write operations with respect to the open (activated) subpage. In alternative embodiments, the activated subpage may exactly match the quantum of data to be read or written in the column operation, with the subpage address field and complete column address being one and the same.

In at least one memory component embodiment, described below in reference to FIGS. 6A-6C, memory core control signals asserted in response to a subpage-activating column command are identical to those asserted in response to a non-activating column command (i.e., a column command directed to a previously activated subpage). That is, access control circuitry within the memory component latches the same subpage activation control signals in response to both an initial activating column command and an ensuing "non-activating" command, with the latching operation in response the non-activating command having a null effect with respect to control signal state (i.e., re-latching the same set of control values so that no control signal transition and thus no interference with the previously-triggered subpage activation occurs). One consequence of this design is that activating and non-activating column commands need not be distinguished within the command protocol. That is, the same activate-read or activate-write command type may be used to trigger a subpage-activating access and a non-activating access, depending on whether the specified subpage has been opened (or is in the process of being opened) in response to a preceding column command. Despite the simplified protocol and operational efficiency of this arrangement, activating and non-activating column commands may be differentiated in alternative embodiments to obtain other benefits. In an embodiment discussed below, for example, activating and non-activating commands are differentiated (e.g., encoded with different operation codes) to take advantage of the lower latency of an access to an open subpage.

In general, the row and column commands shown in FIG. 2B are issued in combinations according to a subpage access policy implemented by a memory controller component. In one such access policy, referred to herein as an "open-page" policy, an activated subpage is left open indefinitely to enable a variable number of column operations following an initial row-load command. More specifically, after a controller component operating under an open-page policy opens one or more subpages within a given row and bank, the controller component will not issue a precharge command until it receives a transaction request directed to different row within that bank. FIG. 3 illustrates the general format of an exemplary open-page command sequence, starting with a precharge command (P) to close all open subpages within a previously specified row, followed by a row-load command (L), and then concluding with at least one and optionally multiple activate-read commands (AR) and/or activate-write commands (i.e., an indefinite number of column commands). By contrast, in a "closed-page" access policy, one or more activated subpages corresponding to a given storage row are auto-precharged following a predetermined (though not necessarily fixed) number of column operations. FIG. 3 also illustrates the general format of an exemplary closed-page command sequence, beginning with a row-load command (L), followed by an optional number (including zero) of activate-read commands (AR) and/or activate-write commands, and concluding with an activate-read-precharge command (i.e., activate-read, followed by an auto-precharge) or activate-write-precharge command. Thus, under an open-page policy, each transaction sequence directed to a given storage row and bank begins with a precharge to close the row left open indefinitely during the preceding transaction sequence directed to that bank, while under a closed-page policy each transaction sequence concludes with a precharge operation, generally after a deterministic number of column operations or lapse of a predetermined amount of time. In both the open and closed-page command sequences, the optional activate-read commands may trigger a sub-page activation or, if preceded by an activate-read directed to the same subpage, may access data within a previously activated-subpage and thus constitute non-activating column commands.

FIG. 4A illustrates an exemplary open-page, deferred-activation memory protocol within a synchronous memory system. In general, row and column commands are transmitted from a controller component to a memory component via a command transmission path (i.e., formed by one or more command/address (CA) signaling links) during respective cycles of a clock signal, CK, and read and write data is conveyed between the controller and memory components via a bidirectional data signaling path, DQ. For ease of understanding, the command transmission path, depicted in FIG. 4A and other figures that follow as "CA-ALL," is split into three logical transmission paths according to commands conveyed. More specifically, row-load commands, activate-read commands and precharge commands are depicted as being transmitted on separate logical paths, CA-ROW, CA-COL and CA-PRE, respectively, to emphasize command timing and relationships, but in actuality are transmitted via unified command path, CA-ALL. Also, all commands shown are assumed to be directed to a single, multi-bank memory component, with the bank addressed in a given command implied by shading of the command (or lack thereof). Thus, within the core-specific minimum time between activation operations within the same bank, $t_{RC}$, row load commands (L) to five different banks are issued at clock cycles 0, 4, 8, 12 and 16, respectively. To avoid undue complexity, address values are omitted from shaded row and column commands (and marked in unshaded row and column commands only) but should be understood to be present nonetheless. With regard to address notation, row addresses are denoted in FIG. 4A and other protocol diagrams that follow by 'R<row address>' and column addresses are denoted by 'C<subpage address><offset>'. For example, 'Rx' and 'Ry' denote row addresses corresponding to rows 'x' and 'y' of a given bank, and 'Ca0' and 'Ca1' denote column addresses corresponding to columns of data at different offsets within subpage 'a' of a given row (by contrast, 'Ca0' and 'Cb0' denote column address corresponding to columns of data within different subpages). Finally, core operations directed to a given subpage are identified by reference to the row address and subpage address of the subpage. Thus, a sensing operation with respect to subpage 'a' of row 'x' is identified as operation 'xa.'

Continuing with FIG. 4A, a single-clock-cycle deferral interval (i.e., $t_{RCD-X}=t_{CK}$) transpires between receipt of a row-load command 143 directed to row 'Rx' within a given bank (i.e., L Rx), and receipt of an activate-read command 145 directed to column 'Ca0' of that same bank (i.e., AR Ca0). As explained, in the deferred-activation mode shown, row activation is not initiated in response to row-load command 143, and instead is deferred until receipt of column command 145 at least one clock cycle later. The column address (Ca0) provided in the column command and row address (Rx) provided in the row-load command are jointly applied to select a subpage within the specified storage bank, with activation of the subpage being triggered by receipt of the column command. This result is reflected in the memory core activity sequence shown at the bottom of the protocol diagram, in which global word line pre-selection 180 (Pre-sel GWL) is initiated in response to row-load command 143, and a subpage activation operation 182 ("Sensing Subpage xa") begins one clock cycle later in response to activate-read command 145.

In the particular embodiment shown, subpage activation is assumed to require an interval corresponding to five clock cycles ($t_{CK}*5$, though a longer or shorter interval may apply depending on the memory core technology and/or architecture), and is followed by a restoration operation 184 (i.e., driving the data latched within the sense amplifiers back into the storage cells in preparation for an eventual precharge operation 187 as shown in the core activity timeline) that transpires over the ensuing six clock cycles. One to two clock cycles after the subpage activation (sensing) operation is completed, and concurrently with the restoration of the subpage, a column access directed to the open page is carried out over a $t_{CAC}$ interval, with a column-address-specified column of data being retrieved from the open page (i.e., from the sense amplifiers holding the activated subpage) and routed to a serializing output driver. Thus, the memory component responds to activate-read command 145 by outputting the address-specified column of read data Q(Ca0) 146 after a total column-latency interval (CL) that includes subpage-activation interval, $t_{RCD-Y}$, and column access interval, $t_{CAC}$. In the embodiment shown, read data Q(Ca0) 146 is output over a $t_{CC}$ interval as a sequence of transmit values, where each transmit value includes a number of bits equal to the width of the data signaling interface (W), and the number of transmit intervals or "burst length" is equal to the quantum of column data (the column size) divided by W. In a column write operation (i.e., activate-write command received instead of activate-read command 145), subpage activation is executed as described above, with write data being received over a $t_{CC}$ interval starting at a time delayed relative to completion of the subpage activation operation by interval $t_{CWD}$. In a subpage activation triggered by a column write, the subpage sensing time may be shortened relative to that of a column read due to the data flow direction. That is, the subpage data need not be fully latched in the sense amplifiers before write data is applied as the subpage data will be overwritten anyway.

Still referring to FIG. 4A, activate-read command 145 is followed a $t_{CC}$ interval later by another activate-read command 147 directed to the same bank and thus to the row of storage cells specified by row command 143. For purposes of example, the second activate-read command 147 is assumed to specify an unopened subpage (i.e., the column addresses Ca0 and Cb0 of the two commands 145, 147 correspond to data in different subpages) and thus triggers a second subpage activation. This event is reflected in the core activity timeline which shows sensing (activation) and restoring operations (183, 185) with respect to a second subpage ("Subpage xb") over respective intervals that are staggered by a $t_{CC}$ interval relative to sense/restoration operations (182, 184) for the first subpage. As in the initial activate-read operation, read data 148 is output with a net column latency $t_{RCD-Y}+t_{CAC}$ relative to receipt of activate-read command 147, and thus back-to-back with respect to the read data output in response to activate-read command 145.

Because the subpage activation operations triggered by activate-read commands 145 and 147 are directed to the same storage bank, a single precharge operation may be performed to close all open subpages within the bank and prepare the bank for subsequent pre-selection and subpage activation operations. As shown in the core activity timeline, such a precharge operation (187) is not begun until subpage restoration is completed with respect to the last-received activate-read command; in this case, activate-read command 147. As discussed below, this timing constraint has implications for the memory control protocol, as the final activate-read command in a given transaction sequence may resolve to a subpage opened in response to a previous activate-read command in the same sequence, thus shortening the overall core activity timeline and enabling precharge at an earlier time than shown in FIG. 4A. Such short-interval command sequences are discussed below in reference to subpage-aware memory protocols.

Continuing with the exemplary multi-activate command sequence shown in FIG. 4A (i.e., multiple subpage activations are carried out with respect to row-load command 143), a precharge command 149 is received after a delay that corresponds to the sub-page activation interval, $t_{RCD-Y}$, plus a subpage restoration interval, $t_{RDP}$, and thus at the conclusion of the second subpage restoration 185 for the command sequence shown. The precharge operation itself takes place over a time interval $t_{RP}$, after which a new row-load command 163 directed to the precharged bank may be executed. In the case of an activate-write command sequence, the precharge command is received after a delay $t_{RCD-Y}$ (sub-page activation interval) plus $t_{WRP}$ (restoration time following write operation within the activated subpage).

As FIG. 4A illustrates, command sequences directed to five different banks in round-robin fashion are sufficient to fully consume the available transmission intervals on the command/address path (CA-ALL) and data path (DQ). Thus, while the memory access latency with respect to any single deferred-activation command sequence (e.g., time between arrival of row-load command and read data output) may potentially be increased by as much as $t_{RCD-X}$ relative to an immediate-activation command sequence (i.e., activation triggered upon receipt of row-address-bearing command), peak memory bandwidth remains unchanged and constrained only by the data signaling rate.

FIG. 4B illustrates an exemplary closed-page deferred-activation protocol in which a command sequence directed to a given row and bank is concluded by an activate-read-precharge command. That is, instead of a sequence of activate-read commands followed by an explicit precharge command as in FIG. 4A, an initial activate-read command 145 is followed by an activate-read-precharge command 205 (ARP Cb0). As explained above, the activate-read-precharge command initiates the same core actions as an activate-read command, and additionally schedules an automatic precharge at the conclusion of the subpage activation/restoration operation. This is illustrated diagrammatically by "notional" precharge command 206 (i.e., a command shown in dashed outline to indicate that it is not actually issued, but rather presented to illustrate the timing of operations scheduled or triggered in response to another command) which shows the timing of the precharge operation executed in response to activate-read-precharge command 205, an "auto-precharging" activate-read command. Accordingly, the same sequence of actions (global word line pre-selection, followed by two subpage activations and corresponding column accesses) is effectuated by the command sequences of FIGS. 4A and 4B, but the CA bandwidth consumption is reduced in the latter as no explicit precharge command is transmitted. The freed command/address bandwidth may be re-applied, for example, to enable conveyance of maintenance or configuration commands (e.g., refresh commands, timing calibration commands, signaling calibration commands, register programming commands etc.) without having to interrupt the memory access command stream.

Figure 5A:
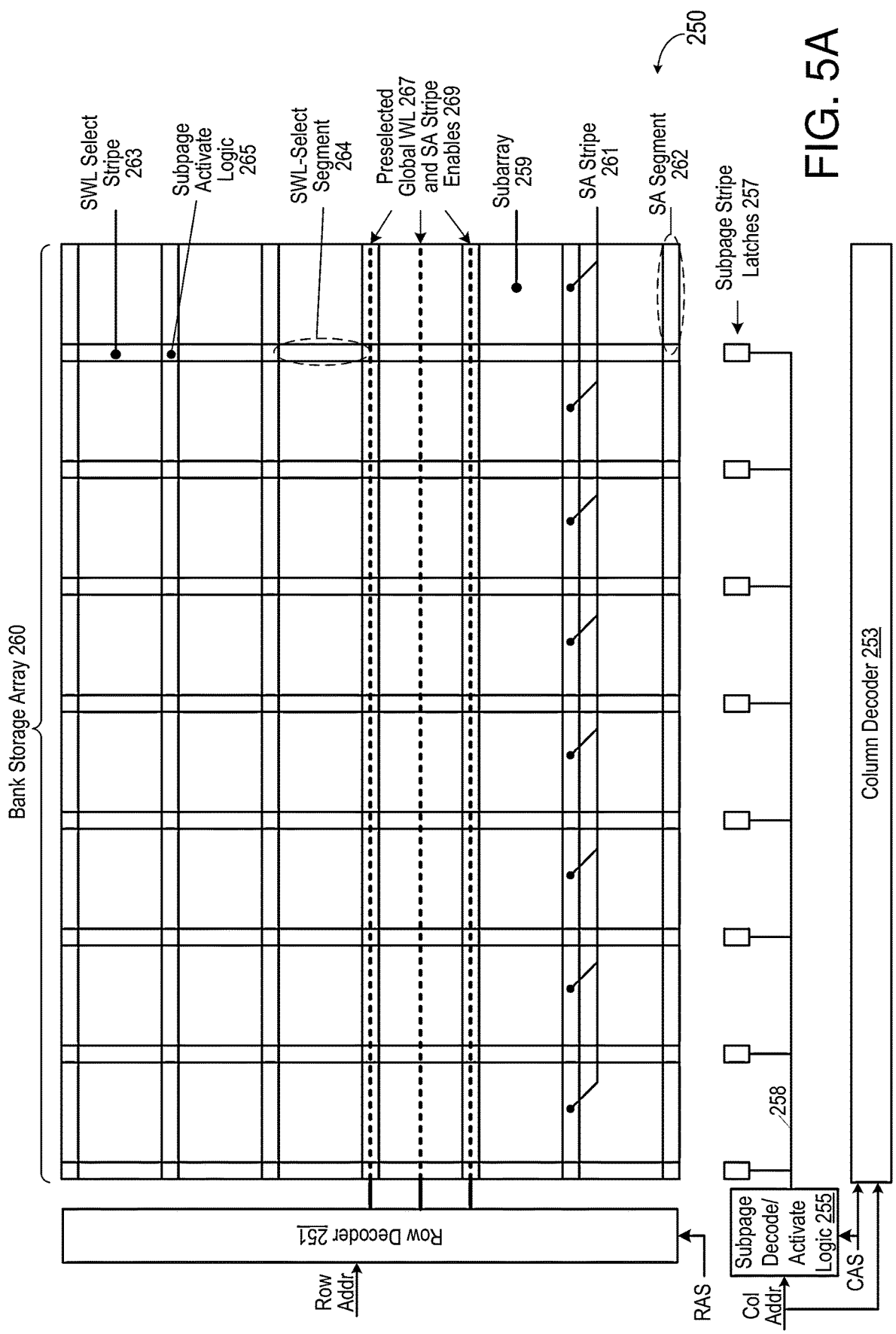
FIG. 5A illustrates an embodiment of a memory bank that may be employed within a multi-bank memory component to enable deferred-activation operations.

FIG. 5A illustrates an embodiment of a memory bank 250 that may be employed within a multi-bank memory component to enable the deferred-activation operations discussed above. As shown, the memory bank includes row and column decoders 251 and 253, subpage decode/activate logic 255, and bank storage array 260. The bank storage array itself includes a number of subarrays 259 arranged in rows and columns and bordered by sense amplifier (SA) stripes 261 and sub-word-line (SWL) select stripes 263. Each sense amplifier stripe and sub-word select stripe is formed by respective segments, referred to herein as sense-amp segments 262 and SWL-select segments 264, with subpage activate logic 265 provided at the corner between each SA segment and SWL-select segment.

When a row-load command directed to memory bank 250 is received within the host memory component (i.e., the memory component containing memory bank 250), a command decoder (not shown in FIG. 5A) forwards the row address within (or associated with) the command to row decoder 251 and outputs a row-address strobe (RAS) signal to row decoder 251. Row decoder 251 responds to the RAS signal by latching the row address (e.g., within an address register or latch) and decoding the latched row address to pre-select a global word line 267. More specifically, the row decoder 251 asserts (e.g., driving the global word line to an active-low state) a row-address-specified one of a plurality of global word lines 267 that extend across memory bank 250, and also asserts a pair of sense-amp stripe enable signals 269 corresponding to the pair of sense amplifier stripes that bound the row of subarrays spanned by the asserted global word line. This pre-selection operation is shown in FIG. 5A by the dashed global word line 267 (i.e., the global word line asserted following the row-address decode) and dashed pair of sense-amp stripe enable signals 269.

Figure 5B:
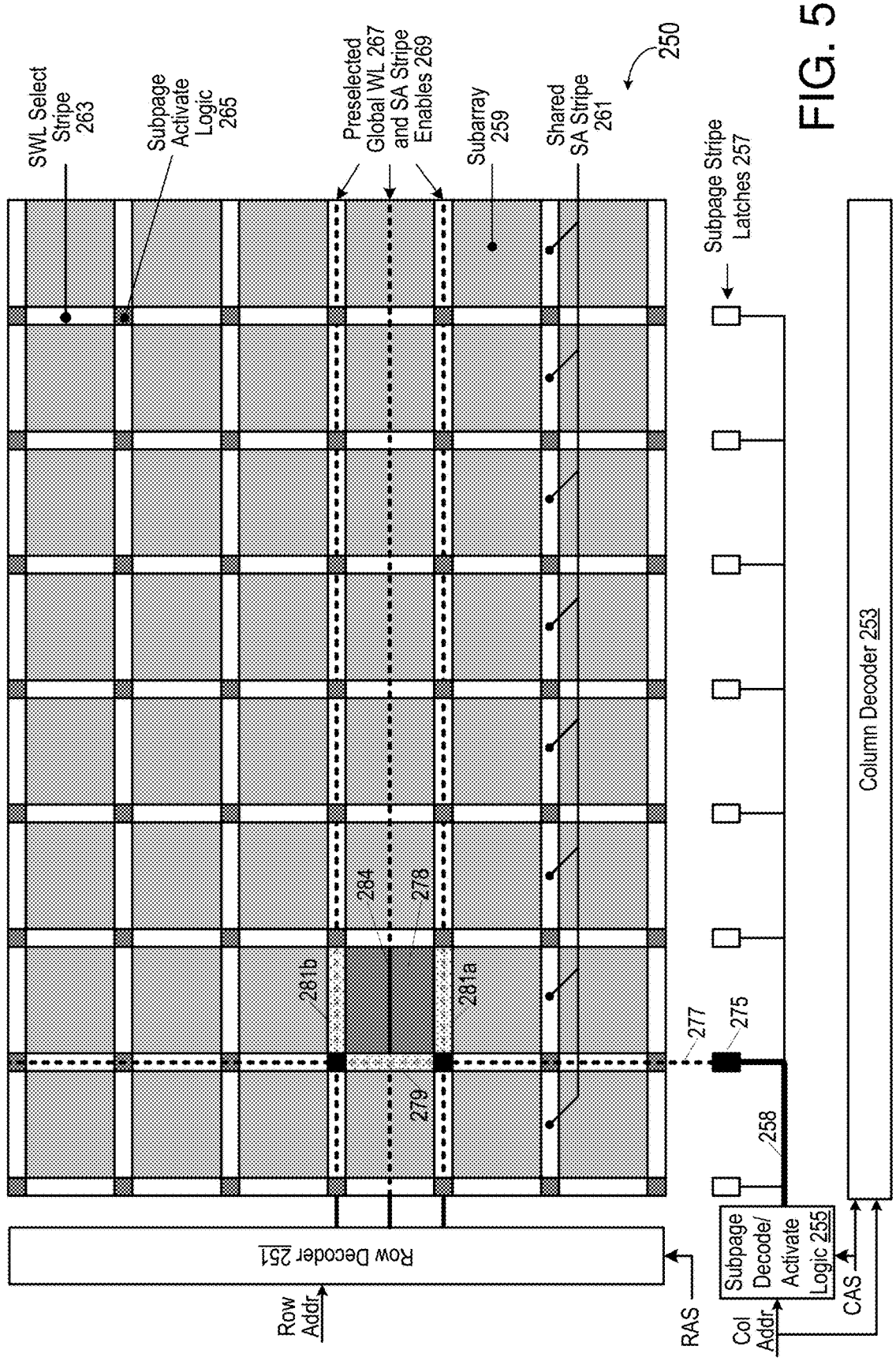
FIG. 5B illustrates a progressed state of the memory bank of FIG. 5A following receipt of an activate-read command within the host memory component.

FIG. 5B illustrates a progressed state of memory bank 250 that follows receipt of an activate-read command within the host memory component. The most significant bits of a column address provided within or in association with the activate-read command are provided to subpage decode/activate logic 255 which, in turn, decodes the column address bits to trigger a latching operation within one of subpage stripe latches 257. In the particular example shown, the column address (or MSBs thereof) resolves to the second of eight subarray columns within memory bank 250 so that the subpage decode/activate logic 255 asserts control signals 258 to trigger a latching operation within the subpage stripe latch 275 for that column of subarrays. In one embodiment, the triggered subpage stripe latch 275 successively raises a sub-word-line (SWL) enable signal and a sense amp (SA) enable signal (shown collectively at 277) which are logically combined (e.g., logically ANDed) with the preselected global word line and sense-amp stripe enable signals, respectively, to enable access to a subrow of storage cells within subarray 278—the subarray at the intersection of the pre-selected global word line and the asserted SWL enable signals. More specifically, the SWL enable signal is logically combined with the preselected global word line within SWL-select segment 279 to raise (or lower or otherwise assert or energize) sub-word line 284 within the subarray specified by the combined row and column addresses, and the SA enable signal (raised shortly after the SWL enable signal) is logically combined with the preselected SA stripe enable signals to enable SA segments 281*a* and 281*b* to sense and latch data output from the storage cells coupled to asserted sub-word line 284. That is, in the embodiment shown, the SA segments 281*a*, 281*b* on either side of the target subarray 278 are coupled alternately to even numbered and odd numbered bit lines of the subarray and thus, even numbered data bits (0, 2, 4, 6 . . . ) are latched in one of the SA segments (e.g., 281*a*) and odd numbered data bits are latched in the other SA segment (e.g., 281*b*). Together, the even and odd data within the SA stripe segments constitute an open subpage (or open subrow). All other SA segments on the same stripes as SA segments 281*a*, 281*b* remain, throughout this operation, in an equalized bit line or precharged state.

Figure 5C:
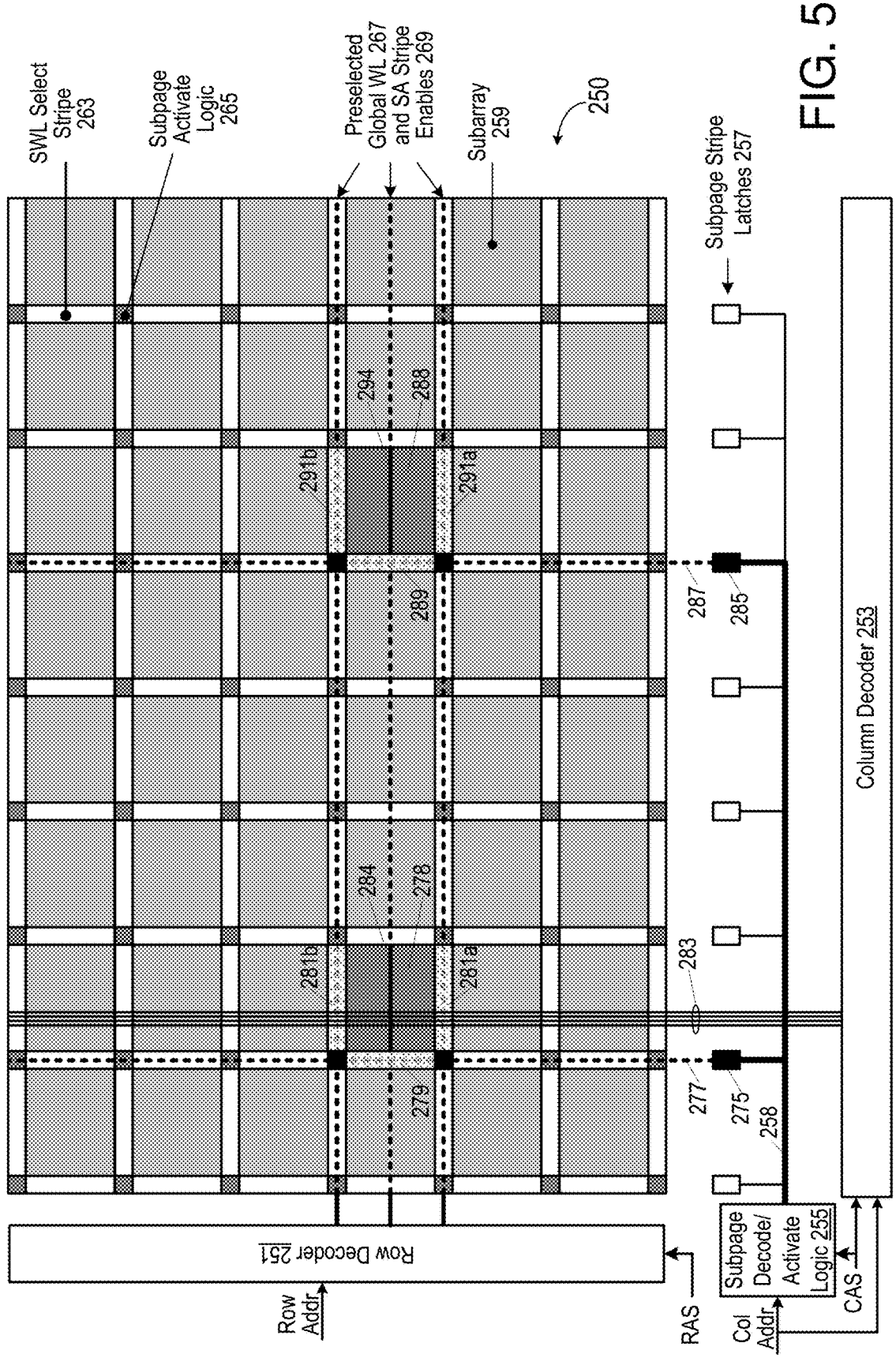
FIG. 5C illustrates a further progression in the state of the memory bank of FIG. 5A as a selected portion of the subpage data is conveyed to a column decoder via selected core I/O lines.

FIG. 5C illustrates a further progression in the state of memory bank 250 as a selected portion of the subpage data is conveyed to column decoder 253 via selected core I/O lines 283. More specifically, column decoder 253 responds to assertion of the column-address-strobe (CAS) signal (or a signal derived therefrom) by establishing a multiplexed path between a column of core I/O lines specified by the column address (i.e., core I/O lines 283) and the data I/O interface of the memory component. Thus, after the address-specified subpage of data is captured within sense amplifier segments 281a, 281b, a column of data is routed via column-address-specified core I/O lines 283 from the open subpage to the data I/O interface where it is serialized and transmitted as read data over the DQ signaling links. The reverse operation occurs in response to an activate-write command, with write data being received within the data I/O interface via the DQ signaling links, deserialized to form a column of write data and conveyed to the open subpage via core I/O lines 283 to overwrite (replace) the corresponding column of data therein. As explained above, during at least part of the column data access via the core I/O lines (i.e., during a $t_{CAC}$ interval in a column read operation and during a $t_{CWD}$ interval in a column write operation), the contents of the open subpage are driven back to the accessed subrow of memory cells to restore the data values therein. That is, because the subpage activation tends to be destructive (e.g., in the case of a DRAM, the small charges stored within capacitive storage cells tend to be dissipated when transferred to the bit lines to enable the cell states to be sensed), the latched values within the sense amplifier segments 281a, 281b are regeneratively applied to recharge the bit lines coupled to subarray 278 and thereby restore the charge states of the originally sensed storage cells. This operation is depicted as "Restoring Subpage xa" (184) in the protocol diagram of FIG. 4A.

In the embodiment of FIGS. 5A-5D, the column of data accessed in response to a given column command is assumed to be narrower than the open subpage (i.e., the MSBs of the column address are applied to subpage decode/activate logic 255, and the full column address is applied to column decoder 253) so that each column access reads or writes only a fraction of the open subpage. Although the widths of the subarrays 259 and accessed data columns may be matched in alternative embodiments (in which case the full column address is supplied to both subpage decode/activate logic 255 and to column decoder 253), the multi-column per subarray arrangement shown may be used to exploit data locality and temporality principles by directing multiple column operations to the same open subpage. Also, while the most-significant bits of the column address are applied to specify the subpage to be activated in the embodiment of FIGS. 5A-5D and other embodiments herein, in all such cases other groups or combinations of bits within the column address may be used to specify the subpage to be activated.

In FIG. 5C, a second subpage activation operation is carried out concurrently with retrieval of the read data column from the initially open subpage. More specifically, a second activate-read command is received within the host memory component a $t_{CC}$ interval after the first, and the column address therein (or associated therewith) is applied to subpage decode/activate logic 255 to trigger a latching operation within another of the subpage stripe latches 257. In the example shown, the column address (or MSBs thereof) resolves to the sixth of eight subarray columns, with the corresponding subpage stripe latch 285 raising SWL enable and SA enable signals (shown collectively at 287) to enable access to a row of storage cells within the subarray (288) at the intersection of the asserted global word line and SWL enable signals. That is, the SWL enable signal is logically combined with the pre-selected global word line within SWL-select segment 289 to raise (or energize) sub-word line 294 within the subarray specified by the combined row and column addresses, and the SA enable signal (raised shortly after the SWL enable signal) is logically combined with the pre-selected SA stripe enable signals to enable SA stripe segments 291a and 291b to sense and latch data output from the storage cells coupled to asserted sub-word line 294.

Figure 5D:
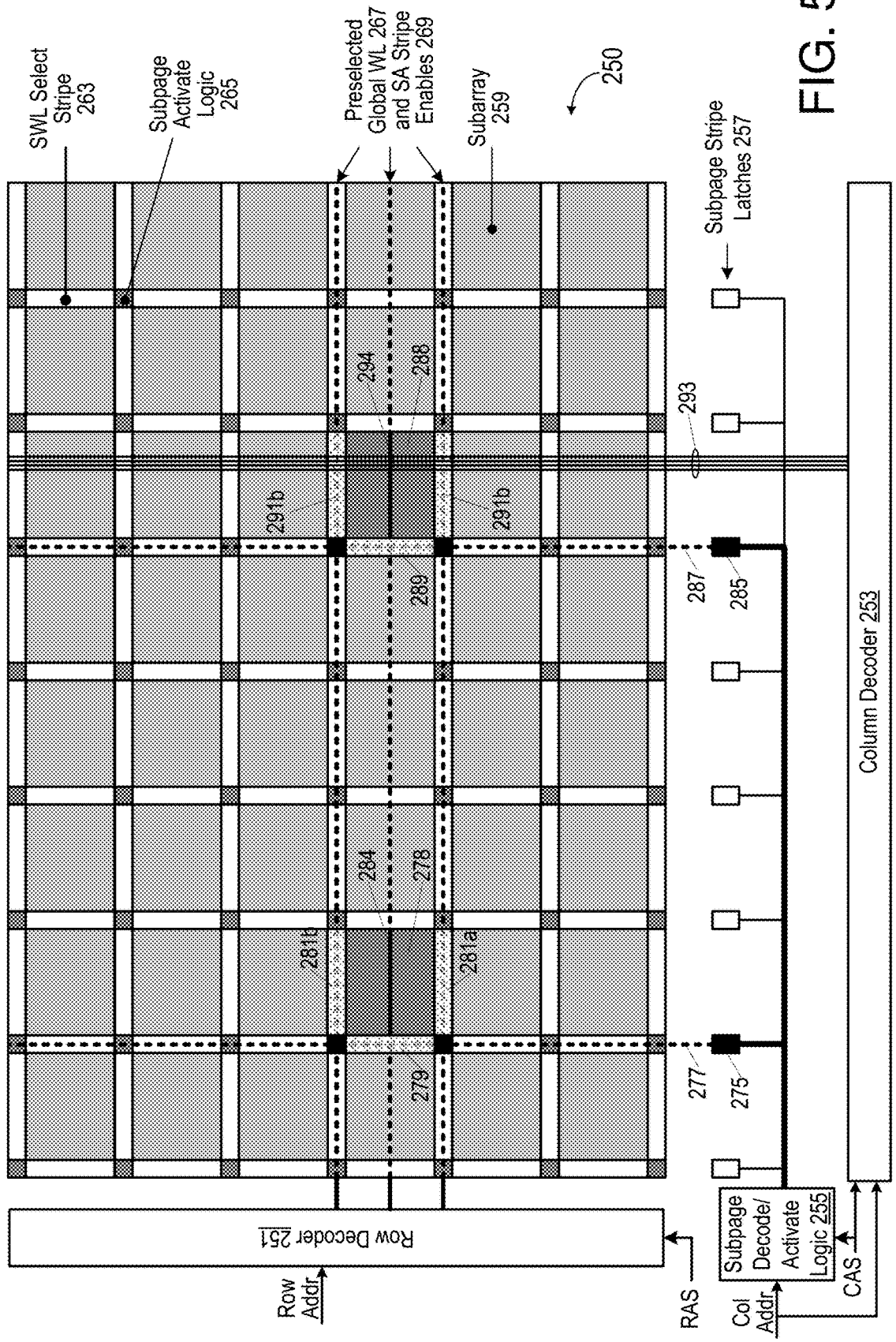
FIG. 5D illustrates a yet further progression in the state of the memory bank of FIG. 5A as data within another subpage data is conveyed to the column decoder via selected core I/O lines.

Approximately one $t_{CC}$ interval after the column access is initiated with respect to subarray 278 (i.e., the time between successive activate-read commands that triggered the subpage activations within subarrays 278 and 288), multiplexing logic within column decoder 253 is switched to enable column access to subpage data from subarray 288. This event is illustrated in FIG. 5D by the depiction of a column-address-specified set of core I/O lines 293 through which read data is retrieved from the newly opened page. At this point one or more additional non-activating column operations may be directed to either of the open subpages, or one or more additional activating column operations may be executed, repeating the sequence of actions described in reference to subarrays 278 and 288. Alternatively, the bank may be precharged in response to an explicit precharge command or an activate-read-precharge command, resetting the subpage stripe latches 257 (thereby lowering all SWL enable signals and SA enable signals asserted by selected subpage stripe latches 275 and 285) and deasserting the global word line and stripe enable signal and thus preparing bank 250 for a subsequent access to a different row of storage cells. Because the other subarrays horizontally adjacent to subarrays 278 and 288 were never disturbed from a precharged state, the precharge command does not affect them, and precharge power consumption is reduced as compared to a conventional row-wide precharge operation.

Figure 6A:
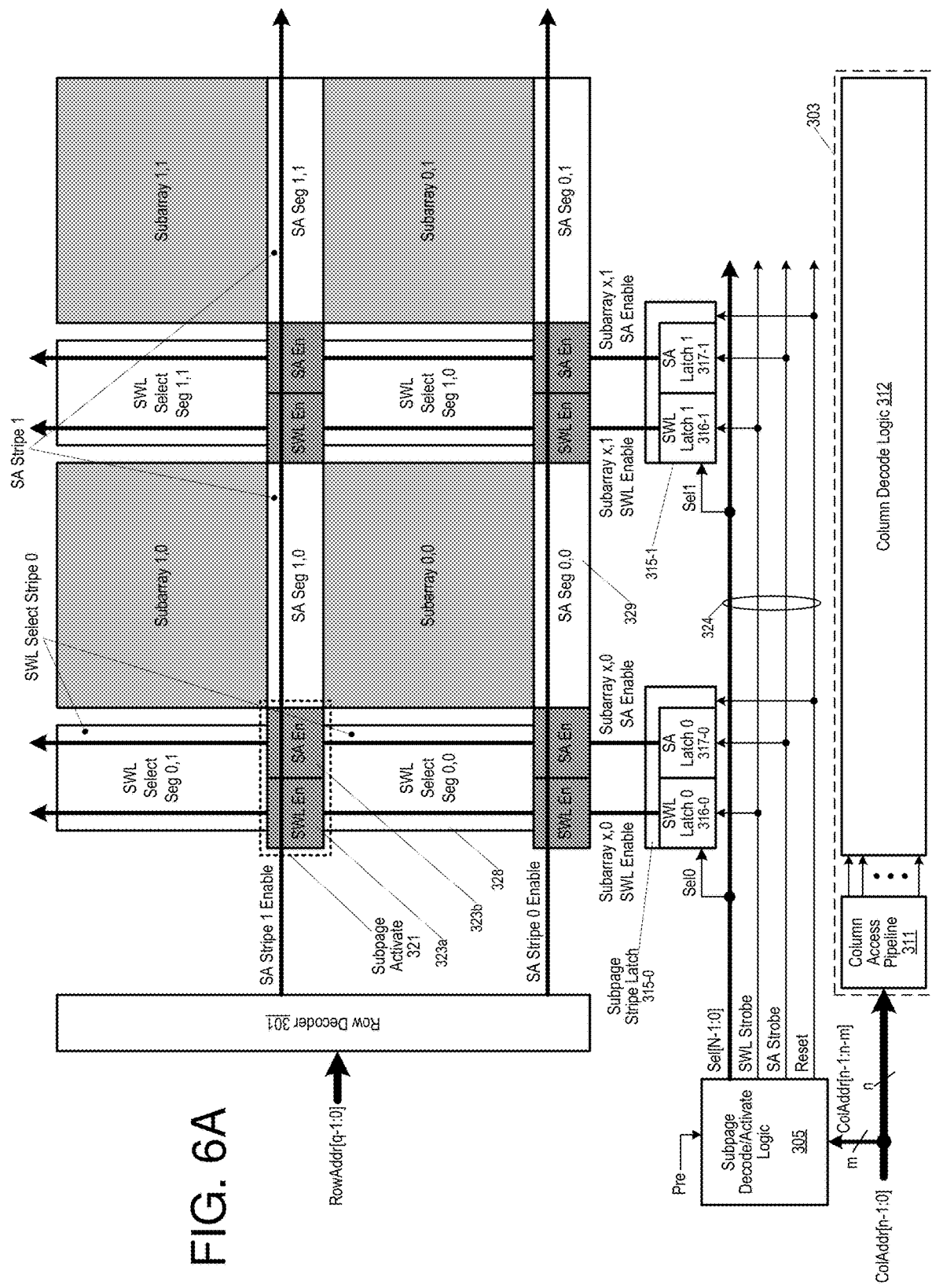
FIG. 6A illustrates more detailed view of exemplary circuit blocks that may be used to implement the memory bank shown in FIGS. 5A-5C.

FIG. 6A illustrates a more detailed view of exemplary circuit blocks that may be used to implement the memory bank 250 of FIGS. 5A-5C. More specifically, a four-subarray corner portion of a larger bank is depicted, with each subarray designated according to its coordinates within a grid of SWL-select stripes and SA stripes: subarray 0,0; subarray 0,1; subarray 1,0; and subarray 1,1. Two sense amp stripes (0 and 1) and two sub-word line stripes (0 and 1) are also shown, with each decomposed into a pair of sense amp segments 329 denominated by stripe number and segment number. Subpage activate circuits 321, each including constituent SWL enable and SA enable circuits 323a and 323b, are disposed at respective corners formed by the SA segments 329 and SWL-select segments 328. Each column of subpage activate circuits is coupled to receive control signals from a respective subpage stripe latch 315-0, 315-1, which is in turn controlled by subpage decode/activate logic 305. Though not specifically shown, column decoder 303 is coupled to the SA stripe segments via core I/O lines that extend parallel to the SWL select stripes across the grid of subarrays. Similarly, row decoder 301 is coupled to the SWL select stripes via global word lines (not specifically shown) that extend across the subarrays parallel to the SA stripes. The row decoder is also coupled to the SA stripes via SA stripe enable signals (two of which are shown) which extend parallel to the SA stripes and are each coupled to respective sets of subpage activate circuits 321 disposed in line with a given SA stripe.

When a row-load command is received, the associated row address is strobed into the row decoder and decoded therein to assert an address-specified global word line and corresponding pair of sense-amp stripe enable signals (i.e., the sense-amp stripe enable signals corresponding to the stripes that bound the row of subarrays spanned by the address-specified global word line). One or more clock cycles later, when a column command is received (e.g., activate-read or activate-write), the most significant 'm' bits of the column address are strobed into subpage decode/activate logic 305, while the full 'n' bits of the column address are supplied to column decoder 303. More specifically, the full column address is supplied to column access pipeline logic 311 to control multiplexing operations within column decode logic 312.

Subpage decode/activate logic 305 decodes the incoming 'm' most significant bits of the column address (also referred to herein as a subrow address or subpage address) to generate a an N-bit select value (i.e., "Sel[N−1:0]," where $N=2^m$) having a set bit in a position that corresponds to the column index of the subarray to be accessed. For example, in a storage bank having an 8×8 matrix of subarrays in which the subarray in row 0, column 1 (i.e., subarray 0,1) is to be accessed, a three bit subpage address corresponding to an initial activate-read command is decoded to generate an eight-bit select value having a solitary set bit in position 1 (i.e., '00000010'). Thereafter, and continuing until a precharge operation is initiated, the subpage address provided with each additional column command is logically OR'd with the previously generated select value to generate the updated select value. Thus, if the subpage address corresponding to a second activate-read command specifies the fifth column of subarrays (e.g., subarray 0,5), the subpage decode/activate logic yields an updated select value having set bits in positions 1 and 5 (i.e., '00100010'). As shown, individual select bits of the select value ("Sel0," "Sel1," etc.) are supplied to respective subpage stripe latches (315-0, 3150-1, etc.) so that, when subpage decode/activate logic 305 asserts a sub-word line strobe signal ("SWL Strobe"), the select bits are loaded into respective SWL latch circuits (316-0, 316-1, etc.) and output therefrom in the form of corresponding SWL-enable and SA enable signals for the corresponding column of subarrays. By this arrangement, the subpage address portion of each incoming column address enables assertion of a respective SWL enable signal, with each new subpage-activating column command enabling assertion of an additional SWL enable signal. In one embodiment, subpage decode/activate logic 305 additionally asserts a sense-amp strobe signal ("SA Strobe") in response to each new subpage address a short time after asserting the SWL strobe, thereby loading the select bits into respective SA latch circuits (317-0, 317-1, etc.) and thus generating sense amp enable signals corresponding to the address-specified column or columns of subarrays.

Still referring to FIG. 6A, subpage decode/activate logic 305 responds to assertion of a precharge signal, "Pre" (i.e., signaling a precharge operation), by resetting the select value to a non-selecting state (i.e., '00000000') and asserting a reset signal to clear the contents of the constituent SWL and SA latch elements (collectively, 316, 317) of each subpage stripe latch. By this action, the SWL enable and SA enable signals are deasserted for all columns of subarrays, thereby enabling subpage decode/activate logic 305 to re-arm the SWL select stripe segments and SA stripe segments for access within a different row. In an alternative embodiment, the reset signal may be omitted, and the SWL and SA strobe signals asserted instead by subpage decode/activate logic 305 to load the non-selecting select value into the constituent latch elements 316, 317 of subpage stripe latches 315, thereby resetting the subpage stripe latches 315 and deasserting the corresponding SWL and SA enable signals.

In one embodiment, each of the constituent SWL and SA latch elements 316, 317 within subpage stripe latches 315 is implemented by a transparent latch that enables the incoming select bit to flow through to the latch output (i.e., as a SWL enable signal or SA enable signal) when the corresponding strobe signal is asserted, and then latches the output state when the strobe signal is deasserted. By this design, the SWL enable and SA enable signals asserted by a given pair of latches remain asserted when those latches are reloaded with same-state select bits, meaning that the subpage decode/activate logic 305 may execute a consistent sequence of actions (updating the select value, then successively strobing the SWL and SA strobe signals) in response to each incoming activate-read or activate-write command, regardless of whether subpage activation has been previously initiated within the target subarray. Thus, if the subpage address associated with a given activate-read command results in assertion of SWL enable signal and SA enable signal for subarrays x,0 (e.g., loading a logic '1' bit into SWL latch element 316-0 and SA latch element 317-0), a subsequent activate-read command bearing the same subpage address yields the same actions within the subpage decode/activate logic as the first, in effect yielding the same select value (including additional set bits resulting from intervening activate-read or activate-write commands bearing different subpage addresses, if any) and glitchlessly latching the same set bits within SWL and SA latch elements 316-0, 317-0. Said another way, the subpage decode/activate logic executes the same sequence of operations regardless of whether an incoming column command triggers a subpage activation (new subpage address and thus responsive assertion of SWL and SA enable signal) or not (i.e., repeated subpage address and thus no change in state of previously asserted SWL and SA enable signals). From a command protocol standpoint, this means that no distinction need be made between activating and non-activating column commands, and thus that a single command type may be used to trigger both types of column access operations. Conversely, because the subpage activation delay is at least partly consumed by the interval between two column commands directed to the same subpage, the net column access latency for the latter of the column commands may optionally be reduced, yielding a reduced column latency (CL) relative to an activating column command. Further, if the last of multiple column commands corresponding to a given row-load command is a non-activating read command (i.e., bears a subpage address matching that provided in another of the column commands), no subpage restoration is required in connection with the last column command (as no subpage activation was triggered by the command) so that bank precharge may be initiated at an earlier point in time (i.e., advanced), thereby reducing the row-to-row latency ($t_{RC}$) with respect to the subject storage bank. Either or both of these latency reductions (CL and $t_{RC}$) may be exploited within a memory system having a subpage-aware controller component—a controller component designed and operated with awareness of the subpage activation architecture within an attached memory component and thus capable of determining, based upon the column addresses provided in connection with a sequence of column access commands whether a given one of the column commands will trigger a subpage activation or not (i.e., is an activating or non-activating command). Examples of such subpage-aware operation are discussed in embodiments below, including an embodiment in which the precharge time is advanced upon determining a given command sequence is concluded by a non-activating column read command, and an embodiment in which activating and non-activating column read commands are differentiated within the command protocol to permit opportunistic column latency reduction.

Figure 6B:
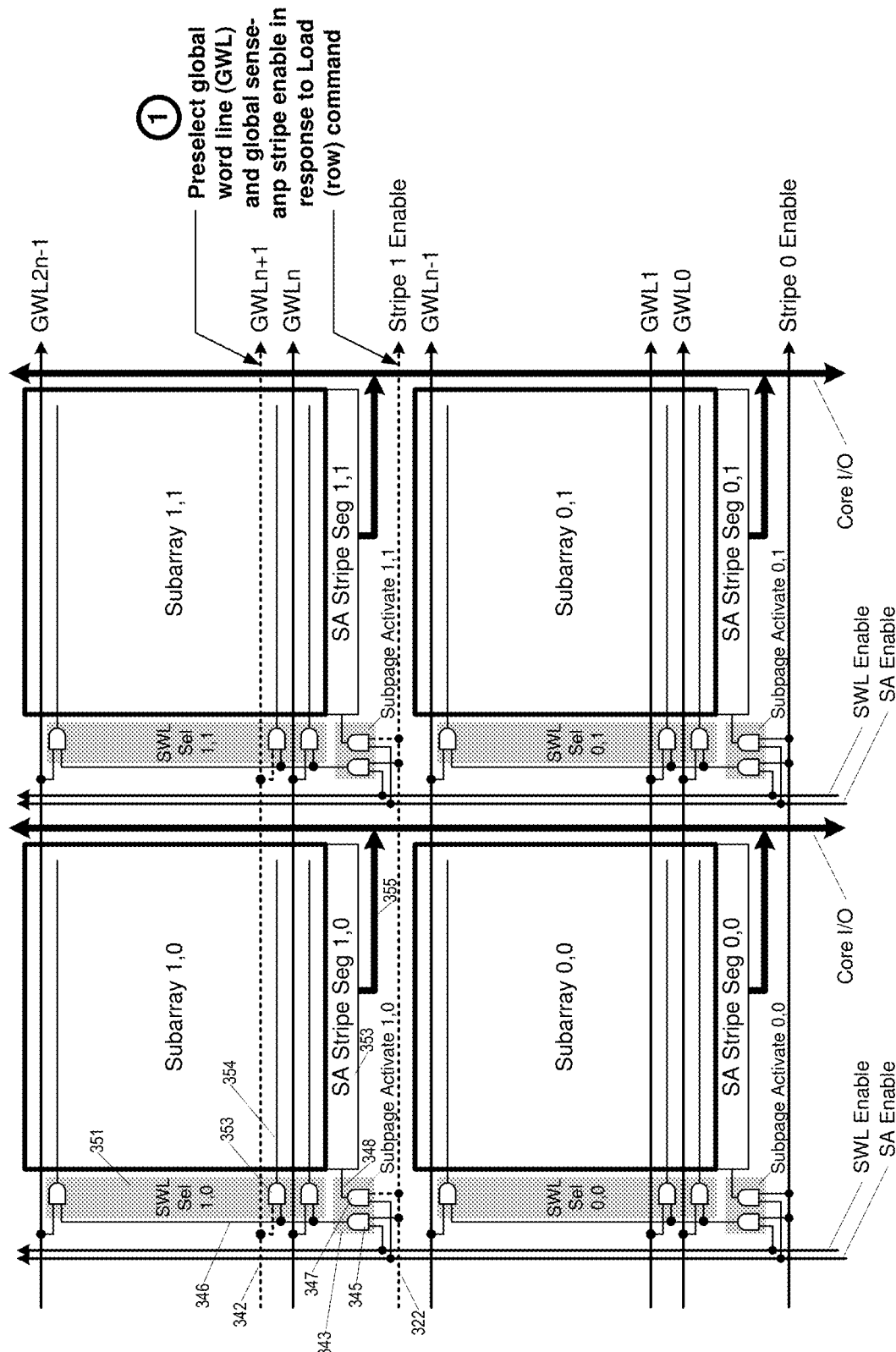
FIG. 6B illustrates embodiments of subpage activate circuits and SWL-select circuits that may be used to implement the subpage activate logic and SWL-select segments shown in FIG. 6A.

FIG. 6B illustrates embodiments of subpage activate circuits 343 and SWL-select circuits 351 (designated by the row and column of the subarrays to which they correspond) that may be used to implement the subpage activate logic 321 and SWL-select segments 328 shown in FIG. 6A. Each SWL-select circuit 351 includes a set of logic AND elements 353 to drive a respective sub word line in accordance with global word line and SWL enable signal inputs. As shown by dashed signal lines in FIG. 6B, global word line GWLn+1 is pre-selected (i.e., asserted in response to a row-load command bearing an address that decodes to that word line), and corresponding stripe enable signals 322 for the row of subarrays spanned by the pre-selected global word line are asserted (note that, for simplicity, only a single SA stripe is shown with respect to each row of subarrays). By this operation, the SWL select stripe segments and SA stripe segments corresponding to the row of subarrays spanned by the global word line are, in effect, armed in preparation for assertion of SWL enable and SA enable signals corresponding to a column-address specified column of the subarrays.

FIG. 6C illustrates the state of the memory bank architecture of FIG. 6B following receipt of a column command. As shown at (2), the SWL enable and SA enable lines corresponding to a target column of subarrays are asserted in succession. The SWL enable signal and SA enable signal are logically ANDed in gate 345 (part of subpage activate circuit 343) to raise a local SWL-select signal 346. The local SWL-select signal 346 and asserted global word line 342 have an intersecting destination at logic gate 353 (part of SWL-select circuit 351) where the signals are logically ANDed to energize subpage word line (or sub-word line) 354. Similarly, the SA enable signal and asserted stripe enable signal are combined within logic gate 347 to raise a SA segment-enable signal 348 and thereby enable a sensing operation within sense amp segment 353 a short while after subpage word line 354 is raised. By this operation, subpage data output from the subrow of storage cells controlled by subpage word line 354 are enabled onto the bit lines of subarray 1,0 and then sensed and latched within the sense amp segment 353. As explained, sense amp segments disposed at opposite sides of a given subarray may be coupled to even- and odd-numbered bit lines, respectively, and simultaneously enabled by respective SA segment enable signals to sense and latch even and odd subpage data.

Still referring to FIG. 6C, the open subpage within sense amp segments bounding the target subarray (i.e., subarray 1,0 in this example) is accessed via the core I/O lines ("Core I/O") as discussed above. More specifically, in a column read operation, the column multiplexer switchably forms a signal path between a column-address-specified subset of the core I/O lines (i.e., a number of lines corresponding to the amount of data to be transferred) and a serializing output driver, and in a column write operation, the column multiplexer switchably forms a signal path between the column-address-specified subset of the core I/O lines and a deserializing receiver, in either case enabling data transfer between the sense amplifiers containing the open subpage and the data I/O interface of the memory component via a selected subset of the core I/O lines and local I/O lines 355 coupled to the enabled sense amp segments.

Reflecting on FIGS. 6A-6C, it should be noted that a number of changes may be made to the circuitry shown to save area and speed up operation. For example, a number of the control signals may be interleaved and driven alternately from the left or right side (or top or bottom) of a given subarray and/or sense-amp segment. Also, the sense-amp enable signal may be decoded outside of the array to generate elemental control signals corresponding to the sequence of actions to be performed as part of a sense or restore operation, with the elemental control signals being delivered to the sense amplifiers to trigger those actions.

FIG. 7A illustrates a reduced-latency transaction protocol that may be implemented by a controller component that is aware of (i.e., designed to assume or detect the presence of) the deferred activation, subpage-access memory component architecture described in reference to FIGS. 5A-5D and 6A-6C. That is, the controller component may evaluate column addresses within a sequence of column commands to determine when a given column command is directed to a subpage that is already open or in the process of being opened (i.e., activated in response to a prior column command). Upon detecting a column command directed to an open subpage (including a subpage still in the process of being opened), the controller component may advance the timing of a subsequent precharge operation on the designed-in assumption that, because no subpage activation was triggered by the command directed to the open subpage, the usual sequence of pipelined delays associated with subpage activation ends with the restoration phase of the open subpage. That is, as shown by the core activity timeline in FIG. 7A, the receipt of two column commands directed to the same subpage (i.e., one command 145 directed to column 'a0' and the other command 375 directed to column 'a1' within subpage 'a'), no subpage activation and thus no subpage sensing or restoration operations are initiated in response to the latter column command 375. Accordingly, a bank precharge operation may be initiated at the conclusion of the core activity with respect to the subpage activated in response to initial command 145 (i.e., after restoration of subpage xa as shown at 184) and thus a column cycle ($t_{CC}$) interval earlier (i.e., the offset between the successive same-subpage column commands) than in the case where successive subpage activations are triggered. This result is illustrated in FIG. 7A by the early transmission of precharge command 149 (i.e., arriving clock edge 12 instead of clock edge 14), and corresponding early execution and completion of the precharge operation shown at 187 within the core activity timeline. The net result is that the total transaction time with respect to the row and thus the intra-bank row-to-row latency, $t_{RC}$, is reduced by a $t_{CC}$ interval.

In the embodiment of FIG. 7A, the controller component behaves opportunistically with respect to the outgoing command sequence, dynamically establishing one of two different $t_{RC}$ latencies according to whether the last of the column commands triggers a subpage activation or is instead directed to a subpage opened in response to a prior column command in the command sequence (i.e., whether or not the last column command in the sequence is an activating or non-activating column command). In the former case, the timing shown in FIG. 4A applies, with the subpage-sense and restore delay ($t_{RCD-y}+T_{RDP}$) being applied with respect to the last-received column command, and in the latter case, the timing shown in FIG. 7A applies, with the subpage-sense and restore delay being applied with respect to a column command other than the last-received column command (i.e., whichever of the column commands associated with a given row-load command was the last to trigger a subpage activation).

In a memory component that supports the protocol example shown in FIG. 7A, the early precharge operation triggered by command 149 closes the open subpage (including, for example, restoring the subpage sense amplifiers to an un-latched state in preparation for a subsequent subpage activation) shortly after data 376 is conveyed from the subpage sense amplifiers to logic within the data I/O interface and thus does not compromise the column read operation. In memory components that exhibit relatively fast precharge timing, additional delay may be imposed in the precharge circuitry and/or in the command protocol to avoid a race between data retrieval and subpage closure.

FIG. 7B illustrates another exemplary subpage-aware transaction protocol, in this case employing an auto-precharging activate-read command out of order with respect to a non-precharging activate-read command. That is, upon detecting that a pair of column access commands 373 and 375 in a closed-page (auto-precharging) command sequence are directed to the same subpage, the controller component may issue an auto-precharging activate-read command ahead of the non-precharging activate-read command, thereby reversing the command order relative to that carried out in a closed-page command sequence in which the constituent column commands are directed to different subpages and thus each trigger a subpage activation. The net effect is a closed-page access sequence in which precharge is begun earlier (i.e., at the conclusion of the subpage activation triggered by pre-charging activate-read command 353, and thus at a time corresponding to notional pre-charge command 377) to yield a reduced intra-bank row-to-row latency, tRC. As shown at 374, 376, read data output in response to the two column commands is carried out with the column latency ($t_{RCD-Y}+t_{CAC}$) described above. Also, a second closed-page sequence with reverse-order precharging and non-precharging commands (383, 385) and corresponding data output (384, 386) is shown with respect to row-load command 163.

Comparing the open-page and closed-page protocols shown in FIGS. 7A and 7B, it can be seen that, while a dynamic, subpage-aware timing applies in the open-page command sequence of FIG. 7A (i.e., as the precharge command and subsequent row-load command are issued at different times relative to column command transmission according to whether the last of the column commands is directed to an open (or opening) subpage), no change occurs in the sequence of command types regardless of whether the constituent column commands are directed to the same or different subpages. By contrast, in the closed-page protocol shown in FIG. 7B, the controller applies a dynamic, subpage-aware command order in addition to the dynamic command timing, issuing an auto-precharging column command ahead of a non-precharging column command in a sequence of column commands directed to the same subpage (i.e., at least the final column command being directed to a subpage activated in response to a prior column command in the same sequence), and reversing that order when the final column command in the sequence is directed to an unopened subpage and thus triggers a subpage activation. With regard to dynamic timing, though the explicit precharge command is omitted in the closed-page sequence, the shortened $t_{RC}$ latency still applies in the dual subpage access sequence (i.e., the subpage address within the final column command is a duplicate or match of a subpage address within an earlier column command directed to same preselected row), so that the controller component may dynamically shorten or increase the delay between row-load commands directed to the same bank according to the addresses that appear within the corresponding column command sequences.

FIG. 8 illustrates an alternative set of exemplary deferred-activation commands, including the row and column commands shown in FIG. 2B (i.e., load, precharge, activate-read and precharge-activate-read), as well as a pair of non-activating column commands, "Read" and "Read-Precharge", both of which alternatively may be write commands ("Write" and "Write-Precharge). The "Read" and "Read-Precharge" commands are referred to herein as explicit non-activation commands, as their non-activating status is indicated explicitly by a differentiated command code rather than through mere repetition of the subpage address of a prior column command, as in the case of the implicit non-activation commands discussed above. As explained below in reference to FIGS. 10A and 10B, explicit non-activation column commands may be used to effect read and write operations with reduced column latency relative to their activating counterparts, and are thus also referred to herein as low-latency column commands. Thus, contrasting the activate-read command and the low-latency read command presented within FIG. 8, both include device, bank and column address fields, and both initiate a column read operation, but as the difference in command name implies, no subpage activation occurs in response to the low-latency read command, so that the $t_{RCD-Y}$ interval otherwise imposed as part of the total column latency time does not apply. Thus, a $t_{CAC}$ interval after arrival of the low-latency read command, read data is output from the memory component. Similarly, a $t_{CWD}$ interval after arriving of a low-latency write command, write data is received within the memory device for storage within the open subpage.

FIG. 9 illustrates closed-page and open-page access sequences supported by a memory system that explicitly differentiates between activating and non-activating column commands (i.e., as in the command tabulation of FIG. 8). Thus, in addition to the two command sequences presented in FIG. 3 and repeated in FIG. 9, open-page command sequence 391 includes a precharge command to close all open subpages within a previously specified row, followed by a row-load command (L), and then by at least one activating read (or write) command (AR or AW), and then concluding with at least one and possibly multiple low-latency read and/or write commands (R or W). Similarly, an additional closed-page command sequence 392 includes a row-load command (L) followed by at least one activating read (or write) command (AR or AW), followed in turn by an optional number of (including zero) low-latency read and/or write commands (R or W), and then concluding with a non-activating, auto-precharging read command or non-activating, auto-precharging write command (RP or WP).

FIGS. 10A and 10B illustrate examples of open-page and closed-page memory protocols, respectively, corresponding to the activation-differentiated column command sequences 391 and 392 shown in FIG. 9. In FIG. 10A, a row-load command 143 is followed by an activate-read command 145, which is turn followed by a low-latency read command 395 and then a precharge command 149. As shown, because no subpage activation occurs in response to low-latency read command 395, a substantially shorter column latency ($t_{CAC}$) applies in comparison to the $t_{RCD-Y}+t_{CAC}$ column latency of activate-read command 145. Accordingly, instead of being transmitted a $t_{CC}$ interval after the activate-read command, transmission of the low-latency read command may be delayed by the $t_{RCD-Y}$ interval relative to notional activate-read command 394 and thus to a substantially later time (i.e., clock cycle 10 instead of clock cycle 3 in the example shown), thereby freeing command bandwidth in the intervening time interval to permit transmission of other command types. This result may be particularly beneficial in cases where the memory access pipeline is interrupted for some number of clock cycles following transmission of activate-read command 145, as the low-latency read command may be issued at the time shown to maintain data output continuity (i.e., data bursts 146 and 396 are output back-to-back as shown) despite the interruption. Thus, the activation-differentiated command sequence may be sent as an alternative to a non-differentiated command sequence (with implicit non-activation AR command 394 shown notionally to emphasize the timing differences) when circumstances warrant and vice-versa. In either case, precharge command 149 may be advanced by a $t_{CC}$ interval relative to a multi-activation command sequence, thus shortening the net intra-bank row-to-row latency ($t_{RC}$) as explained in reference to FIG. 7A. A second exemplary command sequence bearing a low-latency read command 401 (i.e., following row-load command 163 and activate-read command 165 and yielding data output 402) is shown without the notional activate-read command.

FIG. 10B illustrates an example of a closed-page command sequence in which row-load and activate-read commands (143, 145) are followed by an auto-precharging low-latency read command 397 (i.e., RP Ca1). As shown, low-latency read command 397 is transmitted at a delayed time (i.e., $t_{RCD-Y}+t_{CC}$) relative to activate-read command 145 in accordance with the non-activating column latency (CL=$t_{CAC}$), and triggers a precharge operation after an interval $t_{RDP}-t_{CC}$ (shown by notional precharge command 399) on the assumption that an activate-read command was issued the shortest possible time earlier (i.e., $t_{RCD-Y}+t_{CC}$), thus establishing a net delay of at least $t_{RCD-Y}+t_{RDP}$ between the start times of subpage sense operation 182 and the precharge operation 187. As in the command sequence of FIG. 10A, the advanced precharge timing (i.e., starting the precharge early on the awareness that the subpage last opened was activated in response to an earlier activate-read command) shortens the $t_{RC}$ latency relative to protocols that do not account for non-activating commands.

Still referring to FIG. 10B, it should be noted that an equivalent transaction and timing profile may be effected by issuing an activate-read-precharge command in place of activate-read command 145, and issuing a low-latency read command (e.g., command 395 in FIG. 10A) in place of low-latency read-precharge command 397. In that case, an explicit non-activation read command is still transmitted at the delayed time shown, thus providing the benefits described above with respect to FIG. 10A, but no non-activating read-precharge command type need be sent or even included within the memory system command types.

FIG. 11 illustrates three additional command types that may be supported within a deferred-activation memory system, including an additional row command, "Load-Precharge," and two additional activation-triggering column commands, "PrechargeDelay-Activate-Read" and "PrechargeDelay-Activate-Read-Precharge." The load-precharge command triggers the same pre-selection operation as the row-load command discussed above, and additionally triggers a bank precharge operation concurrently with or prior to the pre-selection operation, and thus may be viewed as a bank-precharging, row-load command. As explained with respect to the protocol diagrams shown in FIGS. 13A-13C, triggering precharge and pre-selection operations with a single command reduces command bandwidth consumption while maintaining an open-page access policy, as no explicit precharge command need be sent (reduced command bandwidth), and yet the bank precharge decision may be deferred until receipt of a request to access a row of memory other than the one for which one or more subpages are open. Thus, the benefits of auto-precharge are obtained (less command bandwidth) without requiring a closed-page access policy.

Still referring to FIG. 11, the additional column commands are subpage-activating read (or write) commands, one with auto-precharge (PARP) and one without (PAR), that instruct the memory component to delay for a pre-activation interval, $t_{RP}-t_{RCD-X}$, before initiating a subpage activation, thus permitting time for the precharge operation initiated by a preceding load-precharge command to complete before commencing subpage activation.

Figure 12:
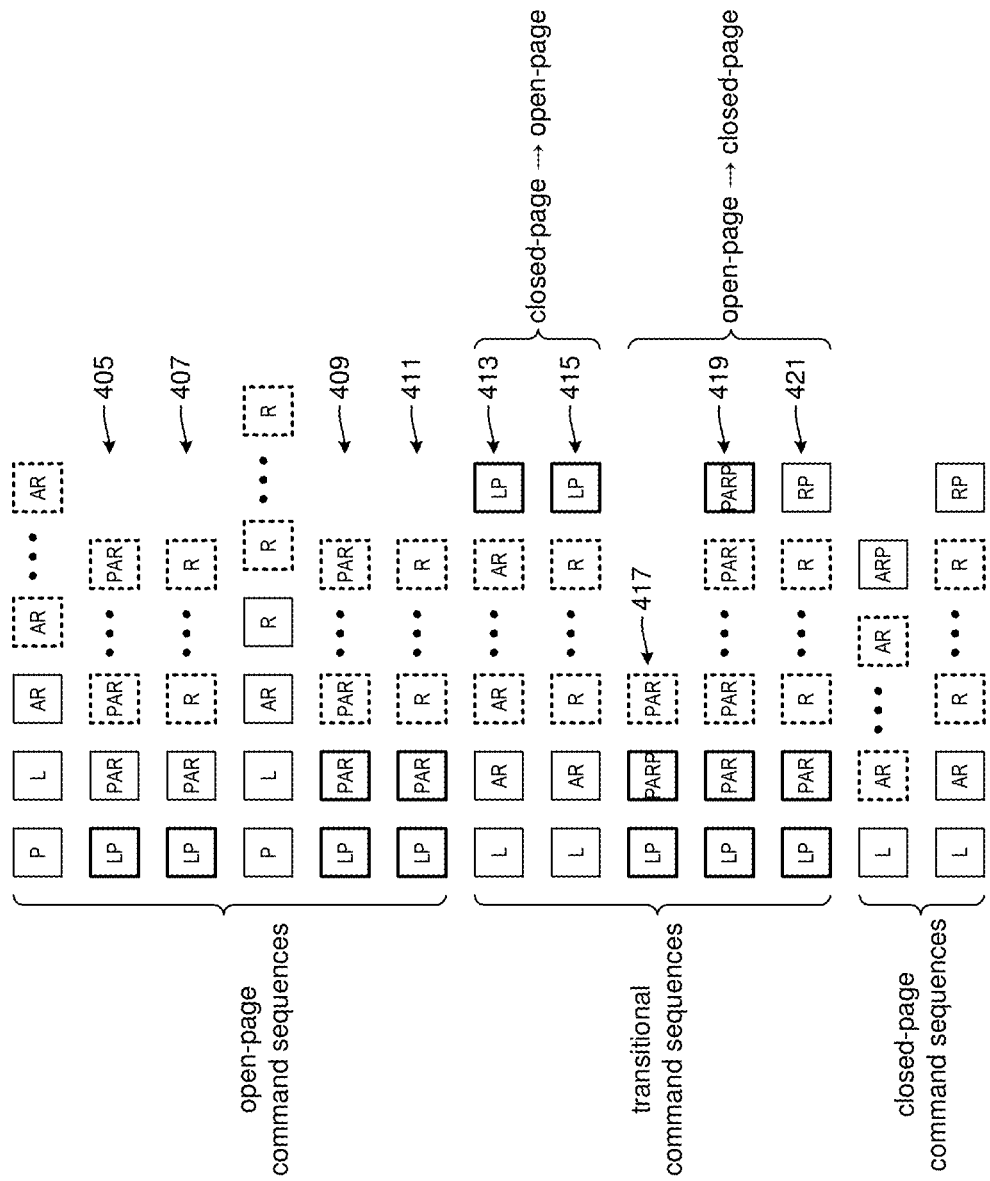
FIG. 12 illustrates additional open-page command sequences and transitional command sequences made possible by the additional load-precharge command and the pre-activation-delay column commands shown in FIG. 11.

FIG. 12 illustrates additional open-page command sequences 405, 407, 409, 411 and transitional command sequences 413, 415, 417, 419, 421 (i.e., transitioning from an open-page access to a closed-page access or vice-versa) made possible by the additional load-precharge command and the pre-activation-delay column commands, together with the two open-page command sequences and two closed-page command sequences described in reference to FIG. 9. Each of the additional open-page command sequences begins with a load-precharge command (LP), thus initiating a precharge operation with respect to an address specified bank, followed or accompanied by a pre-selection operation to assert to an address-specified global word line and corresponding sense amp stripe enable signals within that bank. In one embodiment, the pre-selection operation is carried out in the final clock cycle of the precharge interval, thus hiding time required to perform the pre-selection operation under the precharge interval. In an alternative embodiment, the pre-selection operation is carried out at an earlier time with respect to the precharge interval (e.g., at the beginning or middle of the precharge interval). In either case, the subpage latches are reset as part of the precharge operation so that subsequent assertion of an address-specified global word line and sense amp stripe enable signals does not interfere with the precharge operation. In an alternative embodiment, the pre-selection operation may be deferred until completion of the precharge operation so that the two operations are carried out sequentially rather than in parallel.

Still referring to FIG. 12, the load-precharge command in each new open-page command sequence is followed by a non-precharging, precharge-delay column command (PAR) that initiates, after a precharge delay interval ($t_{RP}$), a subpage activation operation and then a column access (read or write). As shown, the pre-activation-delay column command is followed by one or more additional pre-activation-delay column commands (PAR) in command sequences 405 and 409. An ensuing open-page command sequence may then begin with either an explicit precharge operation (thus transitioning from a command sequence that begins with a combined load-precharge command to one that begins with an explicit precharge command) or by another load-precharge command. Alternatively, because the pre-activation-delay column command triggers a subpage activation, the pre-activation-delay column command may be followed by one or more non-activating column commands (i.e., read or write commands directed to the open subpage) as shown in command sequences 407 and 411, with the ensuing command sequence beginning with either an explicit precharge command or another load-precharge command.

Still referring to FIG. 12, the transitional command sequences include open-page to closed-page transitions that begin with a load-precharge command (thus concluding an open-page command sequence) and terminate with an auto-precharge column command (thus establishing a closed-page sequence) as well as closed-page to open-page transitions that begin with a row-load command, but conclude with a load-precharge command (the assumption being that the row-load command is applied instead of the load-precharge command due to conclusion of the preceding command sequence by an auto-precharging column command, though this need not be the case).

In each of the open-page to closed-page transitional sequences 417, 419, 421, the load-precharge command (LP) is followed by a pre-activation-delay column command (PARP or PAR), including a first sequence 417 in which an auto-precharging pre-activation-delay column command (PARP) is followed by an optional pre-activation-delay column command (PAR). That is, the PARP command is issued on the determination by the controller component that the ensuing PAR command, if any, is directed to the same subpage as the PARP command and thus will trigger no new subpage activation (i.e., constitutes an implicit non-activation column command due to the subpage address match with respect to the preceding PARP command), thus permitting a shortened $t_{RC}$ cycle. In the other open-page to close page command sequences 419 and 421, a non-precharging pre-activation delay command (PAR) is issued following each load-precharge to initiate a deferred subpage activation (i.e., triggering the subpage activation after a $t_{RP}$ delay less a $t_{CK}$), followed either by an optional number of additional PAR commands (sequence 419) or by an optional number of low-latency column commands (sequence 421). In the examples shown, sequence 419 is concluded by an auto-precharging pre-activation delay command (PARP), and sequence 421 is concluded by an auto-precharging non-activating column command (RP).

Closed-page to open-page transitional sequence 413 is similar to the open page command sequence described in reference to FIG. 3, except that, instead of an explicit precharge command, a load-precharge command (LP) is issued to trigger both a precharge operation for the subject command sequence and a row-load operation for a subsequent command sequence. Similarly, transitional sequence 415 is akin to open page command sequence 391 described in reference to FIG. 9, except instead of an explicit precharge command, a load-precharge command (LP) is issued to trigger both a precharge operation for the subject command sequence and a row-load operation for a subsequent command sequence.

FIG. 13A illustrates an exemplary open-page memory protocol employing a load-precharge command. After an initial row-load command 143 and activate-read commands 145, 147 yield a pair of open subpages (and corresponding read data transmissions, 146 and 148), load-precharge command 423 is issued during the command transmission interval otherwise occupied by an explicit precharge command (i.e., shown notionally at 424) to precharge the address-specified bank and also to schedule a row-load operation. Accordingly, the bank is precharged over interval $t_{RP}$, and the row-load operation is carried out immediately thereafter, as though a load command (shown notionally at 429) was received during the final clock cycle of the precharge interval. As explained, this arrangement lowers the overall command/address bandwidth consumption of open page transactions as no explicit precharge operation need be transmitted.

Still referring to FIG. 13A, because load-precharge command 423 triggers a deferred row-load execution (i.e., schedules the pre-selection operation for execution at the conclusion of the bank precharge, though such execution may be carried out earlier as discussed), subpage activation operations are similarly deferred. Thus, a $t_{RCD-X}$ interval after transmission of load-precharge command 423, an initial precharge-delayed column command 425 is transmitted to trigger $t_{RP}$-delayed activate-read operations corresponding to notional activate-read command 431 (i.e., deferred execution of subpage activation and column read operations are carried out as though in response to an activate-read command received at the time shown by notional command 431) and thus output of read data 426 (Q(Cc0)) after a total column latency of $t_{RP}+t_{RCD-Y}+t_{CAC}$. A $t_{CC}$ interval after transmission of command 425, a second precharge-delay column command 427 is transmitted, again to trigger $t_{RP}$-delayed activate-read operations (i.e., activate-read executed at a time corresponding to notional activate-read command 433) and thus data output at 428 (Q(Cd0)). In effect, subpage activation operations are twice-deferred (double-delay) relative to load-precharge command 423, with a first deferral to provide time for the bank precharge operation to complete, and a second deferral according to the pre-activation delay $t_{RCD-X}$ between receipt of the load-precharge command and the pre-activation delay column command 425. As explained above, the tRCD-X interval may arbitrarily long, though shown as a single clock cycle.

Still referring to FIG. 13A, it should be noted that precharge-delay column commands 425, 427 may be replaced by non-$t_{RP}$-delaying activate-read commands in an alternative command protocol. That is, the controller component could transmit activate-read commands at the time shown by notional commands 431 and 433 instead of the precharge-delay column commands shown. Also, in an alternative embodiment, the row-load operation triggered by load-precharge command 423 may be executed during the bank precharge and thus during the $t_{RP}$ interval instead of after the $t_{RP}$ interval as shown by the bank precharge and pre-selection operations 187, 190 within the core activity timeline. In such an embodiment, which is reflected by the timing descriptions within the command table of FIG. 11, the preactivation-delay corresponding to precharge-delay column commands 425, 427 may be reduced by as much as $t_{RCD-X}$ and thus to $t_{RP}$ less $t_{RCD-X}$. In such an embodiment, the activate-read operations triggered by the precharge-delay column commands are advanced by $t_{RCD-X}$ (a clock cycle in the example shown), thus reducing the overall access latency with respect to the load-precharge command, shortening the $t_{RC}$ interval by $t_{RCD-X}$.

FIG. 13B illustrates an alternative command sequence that employs a load-precharge command to reduce CA bandwidth consumption, and in which each subpage-activating column command (441, 451) triggers output of two bursts of data (442a/442b, 452a/452b) from respective address ranges (e.g., column address 'a' and address 'a+x', and 'b' and 'b+x,' where 'x' is the burst length multiplied by the data I/O width). As shown, the double-burst output further reduces CA bandwidth consumption by halving the number of column commands required to generate data output over two successive $t_{CC}$ intervals. Accordingly, only two commands need be issued to access data within a given bank, while maintaining an open-page policy and thus the option to access additional subpages and/or additional columns within a previously opened subpage. While shown in the context of a command sequences initiated by load command 143, and load-precharge command 423, column commands that trigger double-burst outputs may be employed in any other command sequences possible under embodiments disclosed herein. Also, the double-burst may be signaled by the column command itself (e.g., via a field of one or more bits that indicates one of a number of possible multipliers to be applied to a burst length value programmed within a mode register of the memory component, or via a field of one or more bits that directly indicate the burst length), or by a value programmed within a configuration register or mode register of the memory component.

FIG. 13C illustrates another exemplary open-page memory protocol employing a load-precharge command, in this case followed by an auto-precharging column command and then a non-activating column command. More specifically, a precharge-delay, auto-precharging column command (PARP) 455 is transmitted immediately after the load-precharge command 423, thus triggering $t_{RP}$-deferred actions corresponding to notional auto-precharging activate-read command (ARP) 461. A $t_{CC}$ interval after transmission of PARP command 455, a non-auto-precharging pre-activation delay column command 457 (PAR) bearing a column address that resolves to the subpage activated by the preceding PARP command, is transmitted to trigger an access to the open (or opening) subpage. Because PAR command 457 hits the open subpage, no second subpage activation is triggered within the command sequence shown (i.e., PAR command is an implicitly non-activating column command) so that a subpage-aware controller may transmit an ensuing load-precharge command 464 a $t_{CC}$ interval earlier than possible if a second subpage activation was triggered (or if the controller component was unaware whether a second subpage activation was triggered or not), and thus earlier than shown in the protocol of FIG. 13A. As shown, the column latency described in reference to FIG. 13A applies, with read data 456 (Q(Cb0)) and 458 (Q(Cb1)) being output after column latency $t_{RP}+t_{RCD-Y}+t_{CAC}$ relative column commands 455 and 457, respectively. Also, precharge-delay column command 457 yields column access operations as though implemented by notional non-activating column command 463.

FIG. 13D illustrates another exemplary open-page memory protocol employing load-precharge command 423, in this case followed by a non-auto-precharging precharge-delay column command 425 and then by a low-latency, non-activating column command 465. The protocol shown is similar to that of FIG. 13D, except that the non-auto precharging column command establishes an open-bank command sequence, and the low-latency column command need not be issued until the time shown (a $t_{CAC}$ interval prior to the desired data output time instead of the time shown by notional activate read command 467), thus providing the low-latency access benefits described above.

FIG. 14 illustrates embodiments of a controller component 501 and memory component 503 that may be used to implement the various deferred-activation command sequences and protocols described above. Memory component 503 includes seven banks 541₀-541₇ in the example shown (more or fewer banks may be provided in alternative embodiments), together with command/address (CA) logic 543, CA receiver 543, data serializing/deserializing logic 545, data output driver 551 and data receiver 549. Controller component 501 includes a transaction queue 511 coupled between a host interface 510 and memory command and data interfaces. The memory command interface includes optional CA serializing logic 513 and a CA output driver 517, the latter coupled to its memory component counterpart (i.e., CA receiver 547) via one or more CA signaling links 502. The memory data interface includes a data transceiver (formed by data output driver 519 and data receiver 521) coupled to the memory component data transceiver (549 and 551) via one or more data (DQ) links 504, and serializing/deserializing logic 515 coupled between the data transceiver and transaction queue 511 to serialize outgoing write data for transmission via a relatively narrow data path (i.e., enabling a quantum of data containing a number of bits greater than the number of data signaling links to be subdivided and transmitted in sequential transmit intervals) and, conversely, to deserialize incoming read data.

Controller component 501 receives memory transaction requests from one or more host requestors (e.g., a general purpose single-core or multi-core processor, a graphics processor, a digital signal processor, a direct-memory-access (DMA) controller, etc.) via host interface 510 and stores the transaction requests within transaction queue 511. Transaction queue 511 includes logic to convert the incoming transaction requests into memory command sequences which are queued for transmission to memory component 503 via CA path 502 in accordance with the various protocol options and embodiments described above. In the case of write transaction requests, corresponding write data values are also received via host interface 510 and queued within transaction queue 511 for transmission via the data path (i.e., DQ links 504) at predetermined times relative to transmission of corresponding command sequences that instruct storage of the write data. Conversely, in a read transaction request, read data returned by memory component 503 via DQ links 504 is organized within transaction queue 511 for return to the source of the original transaction request via host interface 510. Though only a single transaction queue is shown within controller component 501, multiple transaction queues 511 may be provided to manage memory access transactions with respect to corresponding memory components or independently controllable subsections of a memory component, each transaction queue controlling command and data transfer over a respective memory channel (e.g., formed by additional sets of CA links 502 and DQ links 504).

In the embodiment shown, transaction queue 511 includes a configuration register 523 that may be programmed in accordance with operational characteristics of memory component and memory application requirements. Thus, deferred activation (dAct), variable column latency (i.e., vCL—command differentiated column latency), precharge-delay protocols (dPrchg), multi-burst (i.e., BL—data output over two or more $t_{CC}$ intervals) and any other protocol and command options disclosed herein may all be enabled or disabled and tailored according to application requirements and memory component capability by programming respective control fields within configuration register 523. Further, various control fields may be programmed to establish delay intervals, such as the time between row-load and an initial subpage-activating column command ($t_{RCD-X}$) within a given command transaction, the time between subpage activation and column access ($t_{RCD-Y}$), various latency parameters and so forth. In an embodiment having multiple transaction queues, a single configuration register 523 may be used to establish transaction conversion options (i.e., conversion of host request to memory command sequence) and command-to-command timing parameters (e.g., $t_{RCD-X}$, $t_{RCD-Y}$, etc.) across all transaction queues, or respective configuration registers 523 may be provided within (or otherwise dedicated to) each transaction queue to enable transaction protocols and parameters to be varied from queue to queue.

Command/address values received within memory component 503 (i.e., via CA links 502 and CA receiver 547) are decoded within CA logic 543 to yield bank, row and column control signals (CA-B and CA-R and CA-C, respectively) which are forwarded to the memory banks. In one embodiment, the bank control signals constitute a bank address that enables latching circuitry within the command-specified bank to receive row-control signals or column-control signals as the command may indicate. In the case of a row-load command directed to bank 0, for example, CA logic 543 outputs the row address received in connection with the command onto the row-control lines (CA-R), and outputs a bank control signal indicating a row-load operation together with the bank address (i.e., received in connection with the row-load command) onto the bank-control lines (CA-B). In combination, the bank address and bank control signal enable the row address to be latched within the row decoder for bank 0 (i.e., raising a row-address-strobe (RAS) signal within bank 0), thereby triggering the pre-selection actions described above within the address-specified bank. As another example, CA logic 543 responds to a subpage-activating column command by outputting the column address received in connection with the command onto the column-control lines (CA-C), and outputting a bank control signal indicating the nature and timing of the column operation (e.g., whether a read or write is to be executed and, optionally, the column latency to be effected within the column access pipeline logic) and that, together with a bank address, enables the column address to be captured within the column access pipeline logic (e.g., element 311 of FIG. 6A) and enables a subpage latching operation within the subpage decode/activate logic and subpage stripe latches (e.g., elements 305 and 315 of FIG. 6A). More generally, CA logic 543 issues control signals to the row and column logic circuitry within an address specified bank ($541_0$-$541_7$) to carry out the commanded operations generally as described above with respect to various row and column operations.

In the embodiment shown, memory component 503 includes a mode register 544 that may be programmed by controller component 501 (or by another device, for example, during component production) to control operational aspects of the memory component, including without limitation, subpage size, burst length, delays associated with deferred subpage activation, command-differentiated column latencies (e.g., $t_{RCD-X}$, $t_{RCD-Y}$, CL1, CL2) and so forth. The values programmed within mode register 544 may be applied by CA logic 543 to establish the combination and timing of bank, row and/or column control signals to be asserted in response to a given command and thus enable operations within memory component 503 as described above in reference to timing, protocol and logic diagrams corresponding to various embodiments.

The subpage activate/decode logic (e.g., logic 255 of FIG. 5A) can be provisioned to support other addressing features. For instance, a memory controller may specify a range of subarray granularities, either by setting a mode register or explicitly indicating a mode in a command. At the finest supported granularity, each subarray is independent controlled using the MSBs of a supplied column address. At higher granularities (i.e., coarser granularities), multiple subarrays (e.g., 2, 4, etc., up to an entire row) are activated at once by applying fewer MSBs of a supplied column address. This feature can be used for a full-row refresh, where all subarrays are triggered simultaneously for a refresh operation. Alternatively, a reduced-peak-power refresh operation may be supported, where the subpage activate/decode logic automatically staggers the activate signals to different subarrays in the refreshed row, providing a slightly longer refresh operation with potential significant savings in peak power demanded for refresh.

While a single memory component 503 is shown in FIG. 14, numerous memory components 503 may be provided in alternative embodiments employing various interconnection topologies. For example, sets of memory components 503 may be disposed on respective memory modules (e.g., substrates having packaged or bare-die memory components disposed thereon as in the case of a dual-inline memory module or DIMM) that are removably inserted within sockets connected via printed-circuit-board traces to controller component 501. The set of memory components 503 disposed on a given memory module may include one or more groups or "ranks" of memory components in which the constituent memory components of each rank are coupled to controller component 501 via a shared CA path and via respective data paths, thus enabling the rank of memory components to be accessed in parallel (concurrently) as though a unified device. In an alternative embodiment, memory components 503 implemented on respective integrated circuit dies may be combined, with or without controller component 501, within an integrated circuit package, such as a system in package or multi-chip package (SIP, MCP) or within groups of packages such as package-in-package or package-or-package (PIP, POP) arrangements. In all such cases, the interconnections between the controller component and memory components may be effected by virtually any wired or wireless signal conveyance scheme, including printed wire board traces, bond wires, flex cables (or any other cabling mechanisms), through-silicon-vias (TSVs), inductive or capacitive interconnects and so forth.

Controller component 501 may be a dedicated memory controller (i.e., a packaged or unpackaged IC die designed primarily for the purposes of providing an interface between one or more attached memory components and a processor, DMA and/or another integrated circuit device within a host system), or may constitute part of a processor, application-specific IC (ASIC) or other device that performs functions beyond memory access and control. In either case, a number of the controller component actions described herein may instead be carried out by a programmed processor (or dedicated hardware or combination of hardware and programmed processor), with results or instructions arising from those actions issued to the controller component as a set of commands.

FIG. 15 illustrates a sequence of configuration operations that may be executed by the controller component of FIG. 14 to enable the deferred-activation operations described above. At 575, the controller component determines the command-execution capability of one or more attached memory components via a configuration data source (e.g., a serial presence detect (SPD) memory or other non-volatile storage within or separate from the memory component(s) that contains information characterizing the capabilities of the memory component(s)). At 577, the controller component updates fields within one or more configuration registers (e.g., register 523 of FIG. 14, or multiple instances of such register if provided in association with respective transaction queues) including, for example, selecting between deferred-activation and immediate-activation command protocols (dAct=1 or dAct=0), enabling or disabling transmission of column commands having different column latencies (vCL=1 or vCL=0), enabling or disabling transmission of load-precharge commands and corresponding pre-activation delay column commands (e.g., dPrchg=1 or dPrchg=0, thereby enabling or disabling issuance of commands LP, PAR and PARP as described in reference to FIGS. 11, 12 and 13A-13D), enabling or disabling multi-burst output (BL=1 or BL=0), programming $t_{RCD-X}$ and $t_{RCD-Y}$ delays and any other delays affecting command and/or data transmission/reception timing and that may vary from memory component to memory component or in accordance with application requirements. At 579, the controller component issues register programming commands to the attached memory component(s) in accordance with the command-execution capability of the attached memory devices including, for example and without limitation, programming the data burst length to be output or received in response to a subpage-activating column command, various delay intervals to be applied ($t_{RCD-X}$, $t_{RCD-Y}$, etc.) and/or command differentiated column latencies (CL1, CL2). After programming the mode registers within attached memory components, the configuration operation is deemed to be complete (though additional calibration or initialization procedures may apply) and the controller component may begin issuing sequences of commands as described above and in accordance with the programmed controller component configuration and memory component modes.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific numbers of bits, signal path widths, signaling or operating frequencies, component circuits or devices and the like may be different from those described above in alternative embodiments. Additionally, links or other interconnection between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or deasserts, if explicitly stated or indicated by context) the signal on a signal line coupled between the signal driving and signal receiving circuits. An address or other value provided "in" or "with" a command may be transmitted concurrently (i.e., at least partly overlapping in time) with a group of bits containing a command code or identifier, or prepended, appended or otherwise transmitted in association with the command code or identifier. The term "coupled" is used herein to express a direct connection as well as a connection through one or more intervening circuits or structures. Integrated circuit device "programming" may include, for example and without limitation, loading a control value into a register or other storage circuit within the integrated circuit device in response to a host instruction (and thus controlling an operational aspect of the device and/or establishing a device configuration) or through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

Various modifications and changes may be made to the embodiments presented herein without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A method of operation within a dynamic random access memory (DRAM) component, the method comprising:
   receiving a first command/address value during a first interval, the first command/address value including a row command and row address;
   decoding the row address in response to the row command to activate a first global word line corresponding to a first row of DRAM cells within the DRAM component;
   receiving a second command/address value during a second interval, the second command/address value including a first column command, first sub-row address and first column address;
   decoding the first sub-row address in response to the first column command to activate a first sub-row word line corresponding to a first sub-row of DRAM cells within the first row of DRAM cells, enabling conduction of contents of the first sub-row of DRAM cells to a first sub-row region of a sense amplifier bank within the DRAM component.

2. The method of claim 1 further comprising storing the contents of the first sub-row of DRAM cells within the first sub-row region of the sense amplifier bank in response to the first column command.

3. The method of claim 2 wherein the second interval commences a predetermined time after commencement of the first interval, and wherein a collective time required to activate the first sub-row word line, conduct the contents of the first sub-row of DRAM cells to the first sub-row region of the sense amplifier bank and store the contents within the first sub-row region of the sense amplifier bank exceeds the predetermined time.

4. The method of claim 2 further comprising decoding the first column address in response to the first column command to access a column of data within the first sub-row region of the sense amplifier bank.

5. The method of claim 4 wherein the first column command specifies a column read operation, and wherein accessing the column of data within the first sub-row region of the sense amplifier bank comprises outputting the column of data from the DRAM component via a data signaling interface.

6. The method of claim 4 wherein the first column command specifies a column write operation, and wherein accessing the column of data within the first sub-row region of the sense amplifier bank comprises receiving a column of write data via a data signaling interface of the DRAM component and storing the column of write data within the first sub-row region of the sense amplifier bank.

7. The method of claim 1 wherein the sense amplifier bank comprises a plurality of sense amplifiers corresponding, in quantity, to a quantity of DRAM cells that constitute the first row of DRAM cells.

8. The method of claim 7 wherein the first sub-row region of the sense amplifier bank comprises one of a plurality of sub-row regions within the sense amplifier bank, each of the sub-row regions constituted by a respective subset of the sense amplifiers.

9. The method of claim 1 further comprising:
receiving, while the global word-line remains activated in response to the row command, a third command/address value that specifies a second column command, second sub-row address and second column address; and
decoding the second sub-row address in response to the second column command to activate a second sub-row word line corresponding to a second sub-row of DRAM cells within the first row of DRAM cells, enabling conduction of contents of the second sub-row of DRAM cells to a second sub-row region of a sense amplifier bank.

10. The method of claim 1 further comprising executing a precharge operation with respect to the first sub-row of storage cells in response to the column command after accessing a column of data within the first sub-row region of the sense amplifier bank.

11. A memory component comprising:
a dynamic random access memory (DRAM) array;
a sense amplifier bank;
a command/address signaling interface to receive first and second command/address values during first and second intervals, respectively, the first command/address value including a row command and row address, and the second command/address value including a first column command, first sub-row address and first column address; and
control circuitry to:
decode the row address in response to the row command to activate a first global word line corresponding to a first row of DRAM cells within the DRAM array; and
decode the first sub-row address in response to the first column command to activate a first sub-row word line corresponding to a first sub-row of DRAM cells within the first row of DRAM cells and enable conduction of contents of the first sub-row of DRAM cells to a first sub-row region of the sense amplifier bank.

12. The memory component of claim 11 wherein the control circuitry comprises circuitry to store the contents of the first sub-row of DRAM cells within the first sub-row region of the sense amplifier bank in response to the first column command.

13. The memory component of claim 12 wherein the second interval commences a predetermined time after commencement of the first interval, and wherein a collective time required to activate the first sub-row word line, conduct the contents of the first sub-row of DRAM cells to the first sub-row region of the sense amplifier bank and store the contents within the first sub-row region of the sense amplifier bank exceeds the predetermined time.

14. The memory component of claim 12 wherein the control circuitry comprises circuitry to decode the first column address in response to the first column command to access a column of data within the first sub-row region of the sense amplifier bank.

15. The memory component of claim 14 further comprising a data signaling interface, and wherein the first column command specifies a column read operation, and wherein the circuitry to access the column of data within the first sub-row region of the sense amplifier bank comprises circuitry to output the column of data from the memory component via the data signaling interface.

16. The memory component of claim 14 further comprising a data signaling interface, and wherein the first column command specifies a column write operation, and wherein the circuitry to access the column of data within the first sub-row region of the sense amplifier bank comprises circuitry to receive a column of write data via the data signaling interface and to store the column of write data within the first sub-row region of the sense amplifier bank.

17. The memory component of claim 11 wherein the sense amplifier bank comprises a plurality of sense amplifiers corresponding, in quantity, to a quantity of DRAM cells that constitute the first row of DRAM cells.

18. The memory component of claim 17 wherein the first sub-row region of the sense amplifier bank comprises one of a plurality of sub-row regions within the sense amplifier bank, each of the sub-row regions constituted by a respective subset of the sense amplifiers.

19. The memory component of claim 11 wherein the command/address signaling interface is further to receive a third command/address value while the global word-line remains activated in response to the row command, the third command/address value specifying a second column command, second sub-row address and second column address, and wherein the control circuitry to decode the first sub-row address in response to the first column command additionally decodes second sub-row address in response to the second column command to activate a second sub-row word line corresponding to a second sub-row of DRAM cells within the first row of DRAM cells and enable conduction of contents of the second sub-row of DRAM cells to a second sub-row region of a sense amplifier bank.

20. A memory component comprising:
a dynamic random access memory (DRAM) array;
a sense amplifier bank;
means for receiving first and second command/address values during first and second intervals, respectively, the first command/address value including a row command and row address, and the second command/address value including a first column command, first sub-row address and first column address; and
means for:
decoding the row address in response to the row command to activate a first global word line corresponding to a first row of DRAM cells within the DRAM array; and decoding the first sub-row address in response to the first column command to activate a first sub-row word line corresponding to a first sub-row of DRAM cells within the first row of DRAM cells and enable conduction of contents of the first sub-row of DRAM cells to a first sub-row region of the sense amplifier bank.

\* \* \* \* \*